United States Patent [19]
Komatsu et al.

[11] Patent Number: 4,984,206
[45] Date of Patent: Jan. 8, 1991

[54] RANDOM ACCESS MEMORY WITH REDUCED ACCESS TIME IN READING OPERATION AND OPERATING METHOD THEREOF

[75] Inventors: Takahiro Komatsu; Hiroyuki Yamasaki; Katsumi Dosaka; Yoichi Tobita, all of Hyogo, Japan

[73] Assignee: Mitsubishi Denki Kabushiki Kaisha, Tokyo, Japan

[21] Appl. No.: 372,441

[22] Filed: Jun. 27, 1989

[30] Foreign Application Priority Data

Jun. 27, 1988 [JP] Japan .................................. 63-159805

[51] Int. Cl.⁵ .............................................. G11C 11/34
[52] U.S. Cl. ...................................... 365/208; 365/149; 307/530
[58] Field of Search .................... 365/189.11, 149, 205, 365/207, 208; 307/530

[56] References Cited

U.S. PATENT DOCUMENTS

| | | | |
|---|---|---|---|
| 4,653,029 | 3/1987 | Sato | 365/205 |
| 4,697,112 | 9/1987 | Ohtani et al. | 365/205 X |

Primary Examiner—Joseph A. Popek
Attorney, Agent, or Firm—Lowe, Price, Leblanc, Becker & Shur

[57] ABSTRACT

A dynamic random access memory comprises a pair of write-in data transferring lines (IL, $\overline{IL}$), a pair of read-out data transferring lines (OL, $\overline{OL}$) and a current-mirror type sense amplifier comprising (30) CMOS transistors. The current-mirror type amplifier (30) is connected between a plurality of bit line pairs (BL, $\overline{BL}$) and the pair of read-out data transferring lines (OL, $\overline{OL}$). At the time of data reading, the pair of write-in data transferring lines (IL, $\overline{IL}$) is connected to the corresponding bit line pair (BL, $\overline{BL}$) in response to a write-in column decoded signal (YW) obtained by ANDing a column decoded signal (CA) with a write-in instruction signal (W).

32 Claims, 21 Drawing Sheets

|  |  | N3 | N4 |
|---|---|---|---|
| PRECEDING CYCLE | 0V WRITING | 0V | 5V |
| OBJECT CELL | 5V READING | $< \Delta V_{BL} + \frac{1}{2} V_{CC}$ | $> \frac{1}{2} V_{CC}$ |
|  | 0V READING | $< -\Delta V_{BL} + \frac{1}{2} V_{CC}$ | $> \frac{1}{2} V_{CC}$ |
| PRECEDING CYCLE | 5V WRITING | 5V | 0V |
| OBJECT CELL | 5V READING | $> \Delta V_{BL} + \frac{1}{2} V_{CC}$ | $< \frac{1}{2} V_{CC}$ |
|  | 0V READING | $> -\Delta V_{BL} + \frac{1}{2} V_{CC}$ | $< \frac{1}{2} V_{CC}$ |

FIG.14

|  | N5 | N6 | N7 | N8 |
|---|---|---|---|---|
| ① PRECEDING CELL 0V | 5V | 0V | 5V → 0V | 0V → 0V |
| ② OBJECT CELL 0V | 5V → 5V | 0V → 0V | 0V → 5V | 0V → 0V |
| ③ OBJECT CELL 0V | 5V → 0V | 0V → 5V | 0V → 0V | 0V → 5V |

① → ② ) DIFFERENCE
① → ③ ) BETWEEN OPERATING TIMES

① → ② ) OPERATION TIMES
① → ③ ) ARE EQUAL

_(4,984,206)_

RANDOM ACCESS MEMORY WITH REDUCED ACCESS TIME IN READING OPERATION AND OPERATING METHOD THEREOF

CROSS-REFERENCE TO RELATED APPLICATIONS

The present application is related to the copending application Ser. No. 269,757, filed Nov. 8, 1988 commonly assigned with the present invention.

BACKGROUND OF THE INVENTION

1. Field of the Invention

The present invention relates generally to semiconductor memory devices having separate read and write buses, and more particularly, to an improved construction thereof and an operating method therefor, wherein access time for reading out data from the device is reduced to provide a high-speed operation.

2. Description of the Background Art

Recently, it has been desired in a highly integrated memory device such as a dynamic MOSRAM (Random Access Memory using MOS transistors) to achieve high integration density for increasing storage capacity thereof and to increase the speed of a reading operation by substantially reducing access time (time required for reading out data).

FIG. 1 is a diagram showing schematically an entire structure of a conventional semiconductor memory device. This semiconductor memory device is a dynamic random access memory (DRAM).

In FIG. 1, a memory cell array 101 comprises a plurality of memory cells arranged in of rows and columns so as to have a folded bit line structure. An address buffer 102 generates an internal row address signal and an internal column address signal upon receipt of an externally applied address signal ADD. A row decoder 103 is responsive to the internal row address signal from the address buffer 102 for selecting the memory cells in one row out of the memory cell array 101. The column decoder 104 is responsive to the internal column address signal from the address buffer 102 for selecting the memory cells in one column (a single bit line pair) out of the memory cell array 101. A block 105 (including a sense amplifier portion and an I/O portion) amplifies a potential difference between signals on the bit line pair, and connects the selected bit line pair to a data input-/output line in response to a column decoded signal from the column decoder 104. A write-in buffer 106 receives externally applied write data $D_{IN}$ for converting the received write data $D_{IN}$ into a set of complementary data ($D_{IN}$, $\overline{D_{IN}}$) to transfer the same to the I/O portion in the block 105. A read-out buffer 107 receives the data from the I/O portion in the block 105 for outputting the same to the exterior as an output signal $D_{OUT}$. A clock generator 108 generates signals such as a row address strobe signal $\overline{RAS}$ and a column address strobe signal $\overline{CAS}$ for providing timing of initiating a memory cycle and timing of accepting an address signal.

The row address strobe signal $\overline{RAS}$ from the clock generator 108 is applied to the address buffer 102, the row decoder 103 and the like, while the column address strobe signal $\overline{CAS}$ is applied to the address buffer 102, the column decoder 104 and the like.

As shown in FIG. 2, the row address strobe signal $\overline{RAS}$ provides timing of accepting the row address signal in the address buffer 102, while the column address strobe signal $\overline{CAS}$ provides timing of accepting the column address signal in the address buffer 102. The row address signal and the column address signal are applied to the address buffer 102 in a time series. In addition, timing of decoding the address signal in the row decoder 103 and timing of decoding the address signal in the column decoder 104 are respectively provided by the row address strobe signal $\overline{RAS}$ and the column address strobe signal $\overline{CAS}$.

FIG. 3 is a diagram showing a structure of a main part of the memory cell array shown in FIG. 1, showing specifically one example of a structure of a block 150 represented by a dotted line.

In FIG. 3, a bit line pair BL and $\overline{BL}$ having a folded bit line structure is typically shown. The bit lines BL and $\overline{BL}$ are paired with each other, to constitute a folded bit line pair. More specifically, complementary signals appear on the bit lines BL and $\overline{BL}$. A plurality of word lines are provided in a direction perpendicularly intersecting with the bit lines BL and $\overline{BL}$. In FIG. 3, only a single word line WL is typically shown. Memory cells are respectively provided at intersections of the word line and the bit lines, the memory cells being arranged in rows and columns. In FIG. 3, only a single memory cell 1 provided at the intersection of the bit line BL and the word line WL is typically shown. The memory cell 1 is of a single transistor/a single capacitor type, which comprises a memory capacitor CO for storing information and an N channel MIS (Metal Insulator Semiconductor) transistor Q0.

In order to differentially amplify a potential difference between signals on the bit line pair BL and $\overline{BL}$, there are provided flip-flop type sense amplifiers 2 and 3. The sense amplifier 2 comprises N channel MIS transistors Q1 and Q2. The sense amplifier 2 is activated in response to a signal from sense amplifier activating means 4, to discharge the bit line on the lower potential side such that a potential thereon becomes a ground potential. The sense amplifier activating means 4 comprises an N channel MIS transistor Q5 which is turned on in response to a sense amplifier activation signal SO to connect a node N1 to the ground potential. The sense amplifier 3 comprises P channel MIS transistors Q3 and Q4. The sense amplifier 3 is activated in response to a signal from sense amplifier activating means 5, to charge the bit line on the higher potential side such that a potential thereon becomes a power-supply potential Vcc. The sense amplifier activating means 5 comprises a P channel MIS transistor Q6 which is turned on in response to a sense amplifier activation signal $\overline{SO}$ to connect a node N2 to the power-supply potential Vcc.

Equalizing/precharging means 6 precharges each of the bit lines BL and $\overline{BL}$ at a predetermined precharge potential $V_{BL}$ and equalizes the potentials on the bit lines BL and $\overline{BL}$ before initiation of and after termination of a memory cycle (i.e., at standby time). The precharge potential $V_{BL}$ is generally generated by an internal voltage generating circuit, which is set to a predetermined potential (for example, one-half of the power-supply potential Vcc, i.e., Vcc/2).

Additionally, N channel MIS transistors Q10 and Q11 which are turned on in response to a column decoded signal Y from the column decoder (see in FIG. 1) are connected between the bit line pair BL and $\overline{BL}$ and a data input/output line pair I/O and $\overline{I/O}$. The data input-/output line pair I/O and is generally precharged at a predetermined potential $V'_{BL}$ by N channel MIS transistors Q22 and Q23 which are turned or in response to a clock signal CLK. The data input/output line pair I/O and I/O exchanges data through input/output buffers.

FIG. 4 is a signal waveform diagram showing a reading operation of the conventional semiconductor memory device, the same signs as those shown in FIG. 3 representing the change in potential in the corresponding portions.

Before the time T1, an equalizing signal EQ is at a high level, an equalizing transistor Q7 and precharging transistors Q8 and Q9 are all in the on state, the bit lines BL and $\overline{BL}$ being precharged at a predetermined potential $V_{BL}$.

At the time T1, when the equalizing signal EQ is lowered from a high level to a low level, the transistors Q7, Q8, and Q9 are all turned off, so that the bit lines BL and $\overline{BL}$ are rendered electrically floating. Consequently, a precharging/equalizing operation is terminated. At the time T2, when a single word line WL is selected in response to a row decoded signal from a row decoder, a potential on the word line WL is changed from a low level to a high level. Consequently, the transistor Q0 of the memory cell 1 connected to the word line WL is turned on, so that the memory capacitor C0 is connected to the bit line BL. As a result, the change in potential corresponding to information stored in the memory cell 1 occurs on the bit line BL. When the memory cell 1 stores information "1", the potential on the bit line BL is raised only slightly, as compared with the precharge potential as represented by solid lines in FIG. 4, while the bit line $\overline{BL}$ is held at the precharge potential.

When a potential of a read-out signal on the bit line pair BL and $\overline{BL}$ becomes stable, the sense amplifier activation signals SO and $\overline{SO}$ respectively start to be raised and lowered, at the time T3. Consequently, the transistors Q5 and Q6 are turned on, so that the nodes N1 and N2 are respectively charged and discharged such that potentials thereof respectively become the ground potential and the power-supply potential Vcc. As a result, the flip-flop type sense amplifiers 2 and 3 are both activated, so that the bit line BL on the higher potential side out of the bit lines BL and $\overline{BL}$ is charged through the sense amplifier 3 such that the potential thereon becomes the power-supply potential Vcc, while the bit line $\overline{BL}$ on the lower potential side is discharged through the sense amplifier 2 such that the potential thereon becomes the ground potential. More specifically, a very small potential difference between the signals on the bit line pair BL and $\overline{BL}$ is amplified.

After an amplifying operation of the sense amplifiers 2 and 3, when the column decoded signal Y from the column decoder becomes a high level at the time T4, the transistors Q10 and Q11 are turned on, so that the potentials on the bit lines BL and $\overline{BL}$ are respectively transmitted to the data input/output lines I/O and I/O. The potentials transmitted to the data input/output lines I/O and are amplified by amplifying means such as a preamplifier (not shown) and then, transmitted to the exterior through data output buffers and external output terminals (not shown).

When the transfer of data to the external output terminals is terminated, the potential on the word line WL is changed from a high level to a low level at the time T5, and the column decoded signal Y is also changed from a high level to a low level. Consequently, the potentials on the data input/output line pair I/O and I/O are returned to the precharge potential.

Then, at the time T6, the sense amplifier activation signals SO and $\overline{SO}$ are respectively changed to a low level and a high level, so that the sense amplifiers 2 and 3 are both rendered inactive. On this occasion, the equalizing signal EQ also becomes a high level, so that the precharging/equalizing means 6 is activated. As a result, the bit lines BL and $\overline{BL}$ are precharged at a predetermined potential $V_{BL}$ and the potentials on the bit lines BL and $\overline{BL}$ are equalized. The foregoing is the outline of the data reading operation.

On the other hand, in the data writing operation, timing of a signal waveform is the same as that shown in FIG. 4, in which data flows in a direction opposite to that in the reading operation, i.e., in the direction from a read-out buffer to a selected memory cell through a data input/output line pair. More specifically, write-in data externally applied through a write-in buffer (not shown) is transferred to the data input/output line pair I/O and I/O in a complementary manner (for example, $D_{IN}$ and $D_{IN}$). After an operation sequence from the time T1 to the time T3, when the column decoded signal Y is changed from a low level to a high level at the time T4, the transistors Q10 and Q11 are turned on, so that signal potentials on the data input/output lines I/O and I/O are transmitted to the selected memory cell. In the above described manner, writing is performed.

On this occasion, the sense amplifiers 2 and 3 are also activated at the time T3, and the potential difference between the signals which appear on the bit lines BL and $\overline{BL}$ by the change of the potential on the word line WL to a high level. However, the write-in data is transferred to the data input/output line pair I/O and I/O through the write-in buffer from the exterior. Thus, even if the signal level amplified by the sense amplifiers 2 and 3 is opposite to the signal potential level of the write-in data, the signal potential corresponding to the write-in data appears on the bit line pair BL and $\overline{BL}$. Consequently, the write-in data is written into the selected memory cell through the transistor Q0 in the on state.

As described in the foregoing, in the construction of the conventional semiconductor memory device, data is read out and written through the same data input/output line pair I/O and I/O. Thus, even in reading out data, the bit line pair BL and $\overline{BL}$ is connected to the data input/output line pair I/O and I/O through the transistors Q10 and Q11. In order to read out data at high speed, it is preferable to connect the bit line pair to the data input/output line pair as fast as possible. However, in FIG. 4, when the bit line pair and the data input/output line pair are connected to each other in a period, for example, from the time T2 when the potential on the word line WL rises to the time T3 when a sensing operation is initiated by activation of the sense amplifiers 2 and 3, a load capacitance of the data input/output line pair is applied to the bit lines, so that the levels of the read-out signals on the bit lines are lowered. Consequently, the sense amplifiers can not perform a reliable sensing operation and a malfunction may occur. Thus, it is necessary to connect the bit line pair to the data input/output line pair after the sense amplifiers 2 and 3 are activated and the signal potentials on the bit line pair BL and $\overline{BL}$ become stable. The connection between the selected bit line pair and the data input/output line pair at the time of data reading can not be made before the time T3.

Therefore, the conventional semiconductor memory device has the disadvantage that there is a limit in increasing the speed of a reading operation and it is difficult to shorten access time. More specifically, in a structure in which data is read out and written using the same data input/output line pair, it is difficult to shorten access time in the data reading operation.

Watanabe et al. have proposed a DRAM having write and read data buses separately provided for the purpose of high-speed reading, in an article entitled "BiCMOS CIRCUIT TECHNOLOGY FOR HIGH SPEED DRAMs", '87 VLSI SYMPOSIUM, Digest of Technical Papers, 1987, pp. 79–80. In the DRAM proposed by Watanabe et al., there is further provided a BiCMOS differential sense amplifier between the write data bus and each bit line pair, separately from the conventional flip-flop type sense amplifier.

FIG. 5 is a diagram showing a circuit structure of the DRAM disclosed by Watanabe et al. in the above described prior art document.

In FIG. 5, write data buses IL and $\overline{IL}$ and read data buses OL and $\overline{OL}$ are separately provided on both sides of a bit line pair BL and $\overline{BL}$. In a read mode, the bit lines BL and $\overline{BL}$ are isolated from the write data buses IL and $\overline{IL}$ in response to a signal WRITE. There is provided a BiCMOS differential sense amplifier DS1 between the read data buses OL and $\overline{OL}$ and the bit line pair BL and $\overline{BL}$. An input stage of the BiCMOS differential sense amplifier DS1 is connected to the bit lines BL and $\overline{BL}$ through a clocked inverter CI. Between the read data buses OL and $\overline{OL}$ and a data output buffer DB, there are provided a level shifting circuit LS for shifting signal voltage levels on the read data buses OL and $\overline{OL}$ and another BiCMOS differential sense amplifier DS2 for differentially amplifying an output of the level shifting circuit LS to apply the same to the data output buffer DB.

The write data buses IL and $\overline{IL}$ are respectively connected to the bit line BL and the complementary bit line $\overline{BL}$. Similarly, the read data buses OL and $\overline{OL}$ receive data from the bit line BL and the complementary bit line $\overline{BL}$ through the BiCMOS differential sense amplifier DS1. In FIG. 5, signals CSL1 and CLS2 indicate column decoded signals from a column decoder (not shown).

FIG. 6 is a waveform diagram showing potentials of main nodes in a reading operation of the DRAM shown in FIG. 5. Referring to FIG. 6, description is made of an operation to occur when a memory cell MC storing data "0" is selected, to be connected to the bit line BL.

At the time of reading, the signal WRITE becomes a low level, so that all the bit lines BL and $\overline{BL}$ are isolated from the write data buses IL and $\overline{IL}$. First, the word line WL is selected in response to an externally applied row address signal, to be activated. Thereafter, data stored in memory cells MC connected to the selected word line WL are transferred to the corresponding bit lines BL, resulting in, a small change in voltage on the bit lines BL depending on the data. This small change in the bit line voltage causes conductance modulation of a CMOS clocked inverter CI. This conductance modulation is applied to the input stage of the BiCMOS differential sense amplifier DS1 in response to the column decoded signal CSL1. The BiCMOS differential sense amplifier DS1 has been already activated by the signal CSL1, to amplify the small signal in a short time period by its high current drivability. Data on the bit line pair BL and $\overline{BL}$ are transferred to the read data buses OL and $\overline{OL}$. Signal voltages on the read data buses OL and $\overline{OL}$ are shifted in level and amplified by the level shifting circuit LS and the other BiCMOS differential sense amplifier DS2. The amplified data RD are applied to the data output buffer DB, to be outputted. At the same time, a conventional flip-flop type sense amplifier FS is activated, so that data stored in memory cells are restored. Thus, before or simultaneously with activation of the conventional flip-flop type sense amplifier FS, the data stored in the selected memory cell MC is read out, resulting in high-speed reading.

At the time of writing, the signal WRITE becomes a high level, so that data writing is performed through the write data buses IL and $\overline{IL}$ in the same manner as that in the conventional DRAM shown in FIG. 3.

In this prior art, however, each of the bit lines BL and $\overline{BL}$ is not directly connected to the input stage of the BiCMOS differential sense amplifier DS1 but indirectly connected thereto through the clocked inverter CI. The clocked inverter CI generally has a circuit structure shown in FIG. 7. This clocked inverter comprises a CMOS inverter formed of a PMOS load transistor $Q_{PL}$ and an NMOS driver transistor $Q_{ND}$ connected in a complementary manner, and cut-off switching transistors $Q_{PC}$ and $Q_{NC}$ respectively connected to a power-supply potential Vc and a ground potential. The cut-off switching transistors $Q_{PC}$ and $Q_{NC}$ inhibit an operation of an inverter, i.e., inversion of an input IN to an output OUT when a control clock CLOCK is at a low level and a complementary signal $\overline{CLOCK}$ is at a high level. On the other hand, the clocked inverter functions as an ordinary inverter when the control clock CLOCK becomes a high level.

One reason why the prior art employs the clocked inverter in addition to the BiCMOS differential sense amplifier is that an input impedance of a bipolar transistor is in general substantially lower than that of a MOS transistor. Therefore, in order to avoid adversely affecting a bit line voltage and an amplifying operation of a CMOS flip-flop type sense amplifier, an isolating device is required. Another reason is for supplying a base current to the bipolar transistors in the BiCMOS differential sense amplifier and for amplifying the input amplitude of the differential sense amplifier.

As described in the foregoing, the prior art has a disadvantage in a high-speed reading operation because clocked inverters are required and the reading operation is inherently delayed by the clocked inverters.

Furthermore, the prior art has another disadvantage in view of the occupied area in achieving larger scale integration because each of the clocked inverters comprises at least four transistors.

Additionally, the differential sense amplifier of the prior art is not sufficient for a high-speed operation because it does not have positive feedback for accelerating the amplification of an input voltage to supply an output voltage.

SUMMARY OF THE INVENTION

An object of the present invention is to provide a semiconductor memory device having reduced access time for performing a reading operation and an operating method therefore.

Another object of the present invention is to provide, in a dynamic RAM having separate read and write buses and buffer amplifiers for reading bit line information to the read bus, an improvement wherein the readout rate to the read bus is increased.

Still another object of the present invention is to provide an improved dynamic RAM of a type having separate read and write buses, wherein the fabrication thereof is simplified by providing a CMOS buffer amplifier to read from bit lines to the bus.

Still another object of the present invention is to provide a dynamic RAM of a type having separate read and write buses and buffer amplifiers for reading bit line information to the read bus, wherein the buffer amplifiers are composed only of MOS transistors and the amount of current that must be carried by the amplifiers is reduced.

A further object of the present invention is to provide a dynamic RAM of a type having separate read and write buses, wherein bit lines are directly connected to buffer amplifiers but wherein no interference to the bit lines is applied by the read bus.

A still further object of the present invention is to provide an improved dynamic RAM of a type having separate read and write buses, which is not erroneously operated but can be stably operated.

A still further object of the present invention is to provide an improved dynamic RAM of a type having separate read and write buses, wherein power consumption is reduced.

A yet further object of the present invention is to equalize the effects of noises received by nodes between a read bus and bit line pairs.

In order to attain the above described objects, the semiconductor memory device according to the present invention comprises a memory cell array comprising a plurality of memory cells arranged in rows and columns, row address inputting means, row selecting means, column address inputting means, column selecting means, write-in signal inputting means, a pair of write-in data transferring lines, connecting means, a pair of read-out data transferring lines, and amplifying means.

The row address inputting means receives an externally applied row address. The row selecting means is responsive to the row address from the row address inputting means for selecting one row out of the memory cell array. The column address inputting means receives an externally applied column address. The column selecting means is responsive to the column address from the column address inputting means for selecting a bit line pair to select memory cells in one column out of the memory cell array. The write-in signal inputting means receives an externally applied write-in signal. The pair of write-in data transferring lines transfers data to be written into a memory cell selected by the row address and the column address at the time of data reading. The connecting means is responsive to an output of the column selecting means and the write-in signal from the write-in signal inputting means for connecting the bit line pair designated by the column address to the pair of write-in data transferring lines at the time of data writing. The pair of read-out data transferring lines is provided separately from the pair of write-in data transferring lines for transferring data on the bit line pair selected by the column address at the time of data reading.

The amplifying means is responsive to the output of the column selecting means for driving the pair of read-out data transferring lines in accordance with data on the selected bit line pair. The amplifying means comprises means for detecting a voltage difference of the selected bit line pair, first and second voltage amplifying means for respectively amplifying voltages on bit lines of the selected bit line pair, means for establishing a positive feedback signal flow pass between the first and second voltage amplifying means to increase the rate of the change in voltage of the first and second voltage amplifying means, means responsive to the first and second voltage amplifying means for adjusting first and second currents, means for converting the first and second currents to a voltage difference, and means for applying the voltage difference to the pair of read-out data transferring lines.

The amplifying means amplifies at high speed a very small signal on the selected bit line pair without adversely affecting potentials on the bit lines, to transfer the same to the pair of read-out data transferring lines.

The connecting means connects the bit line pair to the pair of write-in data transferring lines in response to the output of the column selecting means and the write-in signal, so that no node which can be electrically floating exists between the bit line pair and the pair of write-in data transferring lines.

Thus, according to the present invention, no node adversely affecting the potentials on the bit lines exists between the bit line pair and the pair of write-in data transferring lines, so that a malfunction is prevented and access time is shortened.

In accordance with another aspect of the present invention, the amplifying means comprises a plurality of insulating gate type first, second, third and fourth field effect devices respectively provided corresponding to a plurality of bit line pairs, a plurality of first and second nodes respectively provided corresponding to the plurality of bit line pairs, and at least one insulating gate type fifth and sixth field effect devices. Each of the first field effect devices is coupled between a predetermined first potential and the corresponding first node and has a control terminal connected to one of the corresponding bit line pair. Each of the second field effect devices is coupled between the predetermined first potential and the corresponding second node and has a control terminal connected to the other of the corresponding bit line pair. Each of the third field effect devices is coupled between the corresponding first node and one of the pair of read-out data transferring lines and has a control terminal receiving the output of the column selecting means. Each of the fourth field effect devices is coupled between the corresponding second node and the other of the pair of read-out data transferring lines and has a control terminal receiving the output of the column selecting means. The fifth field effect device is coupled between a predetermined second potential and one of the pair of read-out data transferring lines and has a control terminal. The sixth field effect device is coupled between the predetermined second potential and the other of the pair read-out data transferring lines and has a control terminal of the fifth field effect device and a control terminal connected to one or the other of the pair read-out data transferring lines.

In the amplifying means, the first and second field effect devices are rendered conductive when the potentials on the bit lines are equalized before a reading operation, so that the predetermined first potential is applied to the first and second nodes.

Thus, there is no effect of a floating node which is a problem at the time of amplifying a very small potential difference, so that the operation is stabilized and access time is shortened.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a diagram showing the change in potential of the node in the semiconductor memory device shown in FIG. 8 and a semiconductor memory device shown in FIG. 15;

DESCRIPTION OF THE PREFERRED EMBODIMENTS

Figure 8:
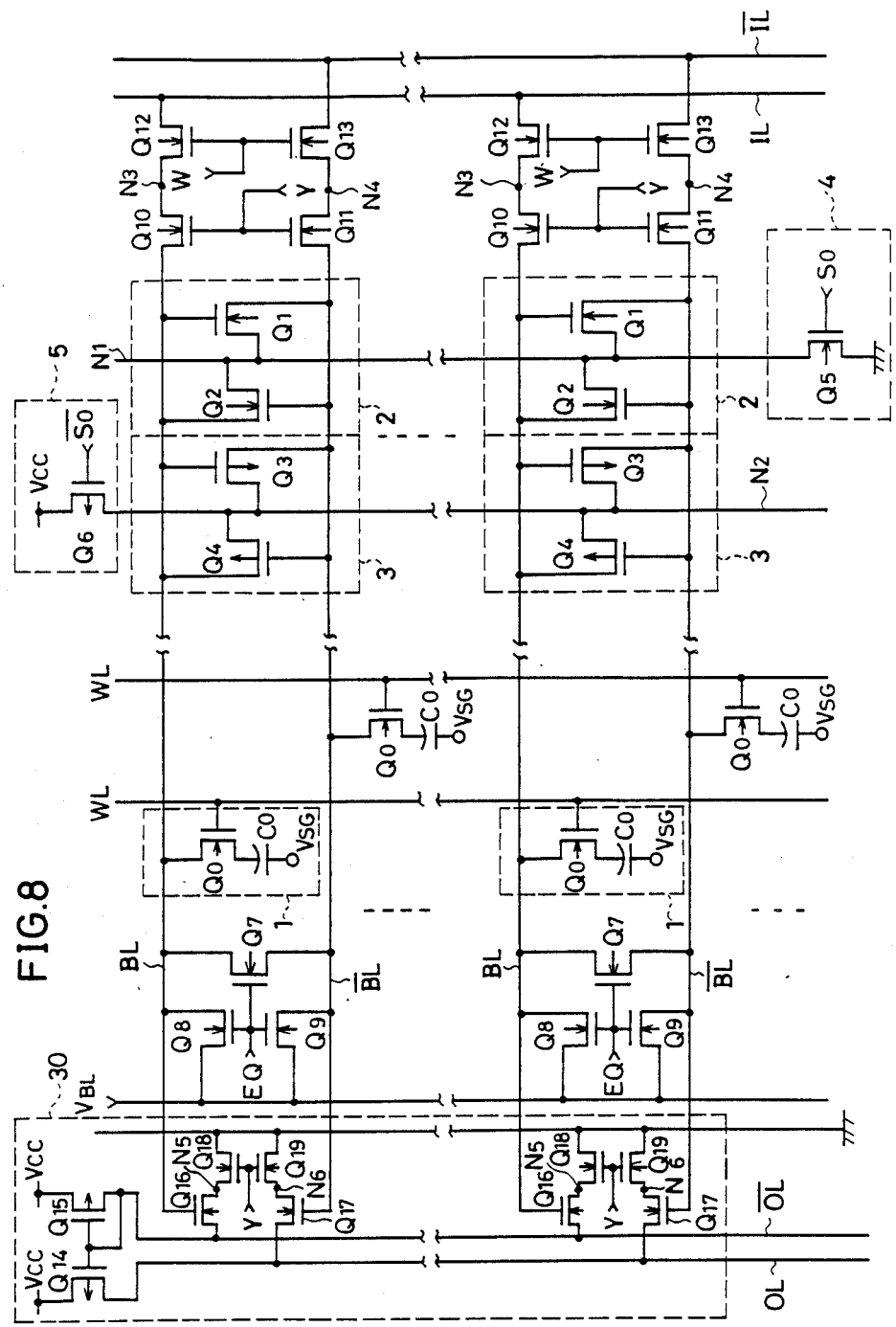
FIG. 8 is a circuit diagram showing a structure of a main portion of a semiconductor memory device which is a basis of the present invention.

FIG. 8 is a diagram showing a structure of a main part of a semiconductor memory device (DRAM) which is a basis of the present invention, portions associated with two bit line pairs being typically shown.

In FIG. 8, bit lines BL and $\overline{BL}$ constitute a folded bit line pair, which is similar to that of the conventional semiconductor memory device. There are provided, in association with this bit line pair BL and $\overline{BL}$, flip-flop type sense amplifiers 2 and 3 respectively activated by sense amplifier activating means 4 and 5 and transistors Q10 and Q11 responsive to a column decoded signal Y for connecting the selected bit line pair BL and $\overline{BL}$ to a data input/output line pair. In addition, there are provided, in association with this bit line pair BL and $\overline{BL}$, an equalizing MIS transistor Q7 for equalizing potentials on the bit lines BL and $\overline{BL}$, and precharging MIS transistors Q8 and Q9 for precharging the bit lines BL and $\overline{BL}$.

The sense amplifier activating means 4 comprises an N channel MIS transistor which is turned on in response to a sense amplifier activation signal SO to connect a node N1 to a ground potential. The sense amplifier activating means 5 comprises a P channel MIS transistor Q6 which is turned on in response to a sense amplifier activation signal $\overline{SO}$ to connect a node N2 to a power-supply potential Vcc. A memory cell 1 has a single transistor/a single capacitor type structure, which comprises a memory capacitor C0 for storing information in the form of electric charges, and an MIS transistor Q0 responsive to a potential on a word line WL for connecting the memory capacitor C0 to the bit line BL. A cell plate of the memory capacitor C0 is coupled to a predetermined voltage $V_{SG}$.

Additionally, there is provided a current-mirror type amplifier 30 corresponding to the bit line pair BL and $\overline{BL}$ to allow high-speed reading. The current-mirror type amplifier 30 has input nodes connected to the bit lines BL and $\overline{BL}$ and an output node comprising readout data transferring lines OL and $\overline{OL}$. The current-mirror type amplifier 30 comprises a first amplifying inverter formed of a P channel MIS transistor Q15 and an N channel MIS transistor Q16 and a second amplifying inverter formed of a P channel MIS transistor Q14 and an N channel MIS transistor Q17. In addition, the current-mirror type amplifier 30 comprises activating N channel MIS transistors Q18 and Q19 each having a gate receiving a column decoded signal Y. Furthermore, the current-mirror type amplifier 30 comprises positive feedback provided between the gates of the transistors Q14 and Q15 and an output of the first inverter (i.e., a junction of the transistors Q15 and Q16).

The transistor Q14 has one conduction terminal coupled to the power-supply potential Vcc and another conduction terminal connected to the read-out data transferring line OL. The transistor Q14 has one conduction terminal coupled to the power-supply potential Vcc and another conduction terminal connected to the read-out data transferring line $\overline{OL}$. The transistors Q14 and Q15 have their gates connected to the read-out data transferring line $\overline{OL}$. The transistor Q16 has one conduction terminal connected to the read-out data transferring line $\overline{OL}$ and its gate connected to the bit line BL. The transistor Q17 has one conduction terminal connected to the read-out data transferring line OL and its gate connected to the bit line $\overline{BL}$. The transistor Q18 has one conduction terminal connected to the other conduction terminal of the transistor Q16, another conduction terminal coupled to the ground potential and its gate receiving the column decoded signal Y. The transistor Q19 is connected to the other conduction terminal of the transistor Q17, another conduction terminal coupled to the ground potential and its gate receiving the column decoded signal Y. In this structure, the bit lines BL and $\overline{BL}$ constitute an input node of the current-mirror type amplifiers 30, the read-out data transferring lines OL and $\overline{OL}$ constitute an output node of the current-mirror type amplifier 30. An amplifying portion comprising the transistors Q16 to Q19 is provided for each bit line pair BL and $\overline{BL}$. A constant current supplying portion comprising the transistors Q14 and Q15 is provided in common for the read-out data transferring lines OL and $\overline{OL}$. In addition, the current-mirror type amplifier 30 is employed in view of reduced loss of power, the high-speed operation and electrical isolation between the read-out data transferring lines OL and $\overline{OL}$ (output portion) and the bit line pair BL and $\overline{BL}$ (input portion).

On the other hand, there are provided, between the transistors Q10 and Q11 and write-in data transferring lines IL and $\overline{IL}$, N channel MIS transistors Q12 and Q13 which are turned on in response to a write instruction signal W to connect the selected bit line pair to the write-in data transferring lines IL and $\overline{IL}$. More specifically, the write-in data transferring lines IL and $\overline{IL}$ are employed only for transferring data to be written in the selected memory cell at the time of a data writing operation, which are connected to the selected bit line pair BL and $\overline{BL}$ only at the data writing operation.

Thus, in the above described structure, there are separately provided the write-in data transferring lines IL and $\overline{IL}$ for transferring the write-in data and the read-out data transferring lines OL and $\overline{OL}$ for transferring the read-out data, so that the speed of a reading operation is increased.

Figure 9:
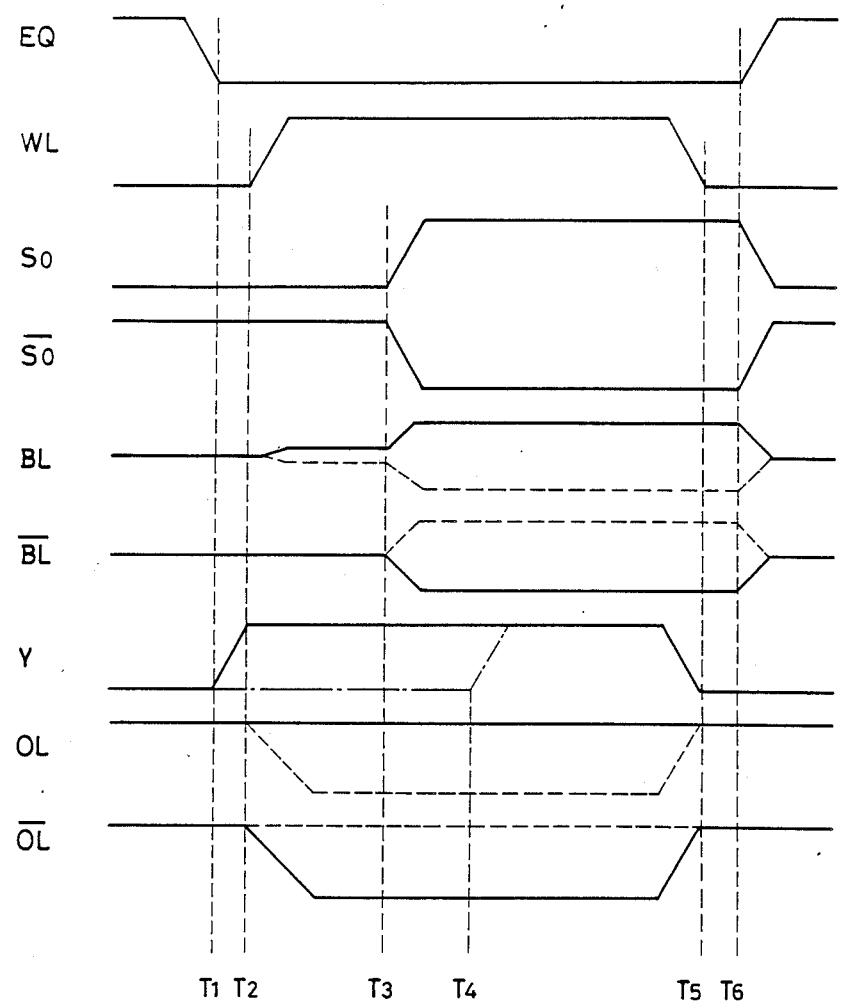
FIG. 9 is a timing chart for explaining an operation of the semiconductor memory device shown in FIG. 8.

FIG. 9 is a timing chart for explaining an operation of the semiconductor memory device shown in FIG. 8. The same reference numerals as those shown in FIG. 8 indicate the changes in signal potential of the corresponding portions.

First, in a data reading operation mode, the write-in instruction signal W is at a low level and both the transistors Q12 and Q13 are in the off state. Consequently, the bit line pair BL and $\overline{BL}$ is disconnected from the write-in data transferring lines IL and $\overline{IL}$.

Before the time T1, an equalizing signal EQ is at a high level, so that the bit lines BL and $\overline{BL}$ are precharged at a predetermined precharge potential through the transistors Q7 and Q9, in the same manner as in the conventional semiconductor memory device.

At the time T1, when the equalizing signal EQ is changed from a high level to a low level, both the equalizing transistor Q7 and the precharging transistors Q8 and Q9 are turned off and the bit lines BL and $\overline{BL}$ are rendered electrically floating.

At the time T2, the word line WL is selected in response to a row address signal from an address decoder (not shown in FIG. 8). When a potential on the word line WL is raised from a low level to a high level, the transistor Q0 in the memory cell 1 is turned on. Consequently, information stored in the memory cell 1 is transferred onto the bit line BL. If the memory capacitor C0 in the memory cell 1 stores information "1", the potential on the bit line BL is raised only slightly, as compared with the precharge potential while the bit line $\overline{BL}$ remain at the precharge potential, as represented by solid lines in the signal waveform diagram of FIG. 9.

As shown in, for example, FIG. 9, if the column decoded signal Y from a column decoder (not shown in FIG. 8) is raised from a low level to a high level at the time T1 the transistors Q18 and Q19 are turned on, so that the current-mirror type amplifier 30 is activated. Thus, as shown in FIG. 9, considering a case in which the current-mirror type amplifier 30 is in the active state at the time T2, when the potential on the word line WL is raised so that the potential on the bit line $\overline{BL}$ is slightly changed, the change in the potential on the bit line BL is amplified at high speed by the current-mirror type amplifier 30, to be transferred to the output nodes OL and $\overline{OL}$. More specifically, as shown in FIG. 9, if the memory cell 1 stores information "1", the read-out data transferring line $\overline{OL}$ is discharged through the transistors Q16 and Q18 at high speed such that a potential thereon becomes the ground potential. On the other hand, the read-out data transferring line OL remains at the power-supply potential Vcc. Thus, a signal corresponding to the read-out data is transferred to the read-out data transferring lines OL and $\overline{OL}$, that is, transferred to a read-out circuit (not shown) comprising a read buffer or the like, to be immediately transferred to an external data output terminal.

In the current mirror type amplifier 30, the bit lines BL and $\overline{BL}$ are respectively connected to the gates of the transistors Q16 and Q17 and the read-out data transferring lines OL and $\overline{OL}$ constituting an output node are respectively connected to one conduction terminals of the transistors Q16 and Q17, sc that a structure is not achieved in which the bit line pair BL and $\overline{BL}$ and the read-out data transferring lines OL and $\overline{OL}$ are directly connected to each other. Thus, load capacitances of the read-out data transferring lines OL and $\overline{OL}$ and the potential levels thereof do not affect the potentials on the bit lines BL and $\overline{BL}$. On the other hand, since the write-in data transferring lines IL and $\overline{IL}$ are respectively disconnected from the bit lines BL and $\overline{BL}$, by the transistors Q12 and Q13, load capacitances of the write-in data transferring lines IL and $\overline{IL}$ do not adversely affect the potentials on the bit lines BL and $\overline{BL}$.

Thus, immediately after the rise of the potential on the word line WL, information can be read out precisely and at high speed by detecting a very small change in the potentials on the bit lines BL and $\overline{BL}$, so that access time at the time of reading can be significantly reduced.

At the time T3, the sense amplifiers 2 and 3 are activated in response to the sense amplifier activation signals SO and $\overline{SO}$, so that a very small potential difference between the signals on the bit lines BL and $\overline{BL}$ is further increased. An amplifying operation of the potentials on the bit lines by the sense amplifiers 2 and 3 is performed mainly to perform a restoring operation for rewriting read-out information to the selected memory cell 1.

At the time T4, if the potential on the word line WL and the column decoded signal Y are changed from a high level to a low level, the current-mirror type amplifier 30 is also brought to the inactive state, so that the read-out data transferring lines OL and $\overline{OL}$ are also charged through the transistors Q14 and Q15 such that the potentials thereon becomes a predetermined precharge potential.

At the time T6, if the sense amplifier activation signals SO and $\overline{SO}$ are brought to the inactive state, the flip-flop type sense amplifiers 2 and 3 are also brought to the inactive state. At the same time, since the equalizing signal EQ is raised from a low level to a high level, the bit line pair BL and $\overline{BL}$ is precharged again at a predetermined precharge potential $V_{BL}$ through the transistors Q7 and Q9.

Although description was made of a case in which the selected memory cell 1 stores information "1", the selected memory cell 1 may store information "0", in which case a signal waveform as represented by dotted lines in FIG. 9 is obtained.

At the time of data writing, the write instruction signal W is at a high level and both the transistors Q12 and Q13 are turned on. On this occasion, external write-in data is transferred to the write-in data transferring lines IL and $\overline{IL}$ from a write-in circuit such as a write-in buffer in a complementary manner (for example, $D_{IN}$ and $\overline{D_{IN}}$).

An operation sequence to the time T5 is the same as that at the time of data writing in the conventional device. At the time T4, when the column decoded signal Y is changed from a low level to a high level as represented by a dash, and dot line in FIG. 9 to select the bit line pair BL and $\overline{BL}$, the transistors Q10 and Q11 are turned on, so that the bit line pair BL and $\overline{BL}$ is connected to the write-in data transferring lines IL and $\overline{IL}$. Consequently, contrary to the time of data reading, the potentials on the write-in data transferring lines IL and $\overline{IL}$ are written in the selected memory cell 1.

Although description was made on a case in which the column decoded signal Y is raised from a low level to a high level at the time T4 in the writing operation, the change of the column decoded signal to a high level is not limited to this timing. For example, the change may be made at earlier timing.

Furthermore, although description was made on a case in which the change of the column decoded signal Y to a high level is made simultaneously with the change of the equalizing signal EQ to a low level, the change of the column decoded signal Y to a high level may be made at slightly slower timing. However, in any case, the column decoded signal Y can be changed to a high level before initiating a sensing operation in the reading operation, so that data can be read out at high speed.

Additionally, although in the above described embodiment, the transistors Q14 and Q15 in the current-mirror type amplifier 30 are connected to the power-supply potential Vcc and the transistors Q18 and Q19 therein are connected to the ground, the level of this power-supply potential is not limited to the same. In addition, the polarities of the transistors constituting the amplifier 30 are not limited to the same. If the polarities thereof are reversed or the level of the power-supply potential is reversed, the same effect as in the above described embodiment can be obtained. In such a case, a relation between the polarities of the signal potentials on the bit lines BL and $\overline{BL}$ and the polarities of the signal potentials applied to the read-out data transferring lines IL and $\overline{IL}$ can be adjusted by suitable selection of the level of the power-supply potential and the polarities of the transistors.

Figure 1:
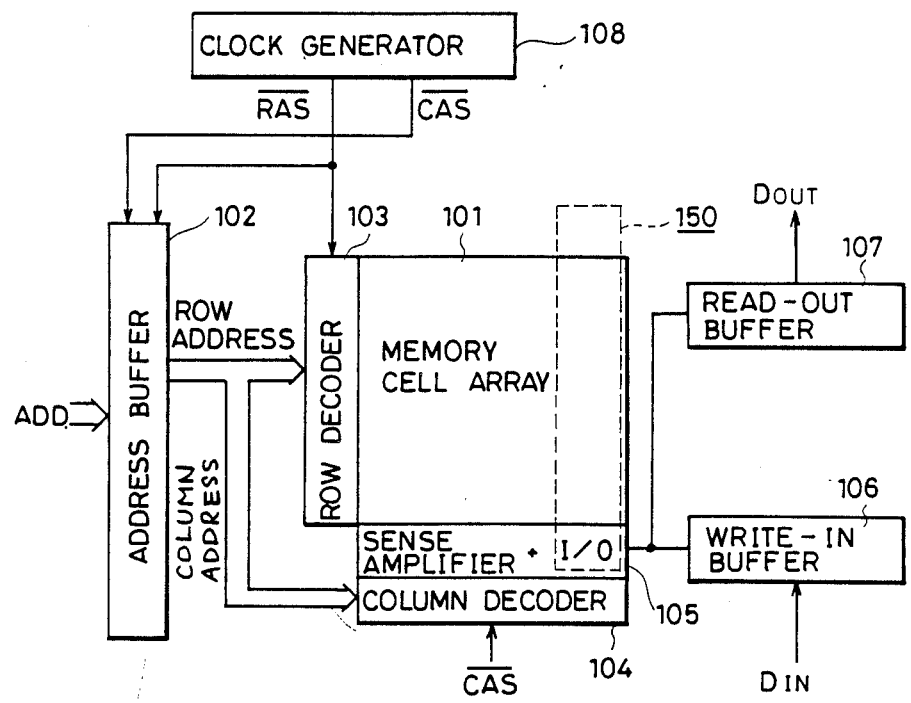
FIG. 1 is a block diagram showing an entire structure of a conventional semiconductor memory device.
Figure 2:
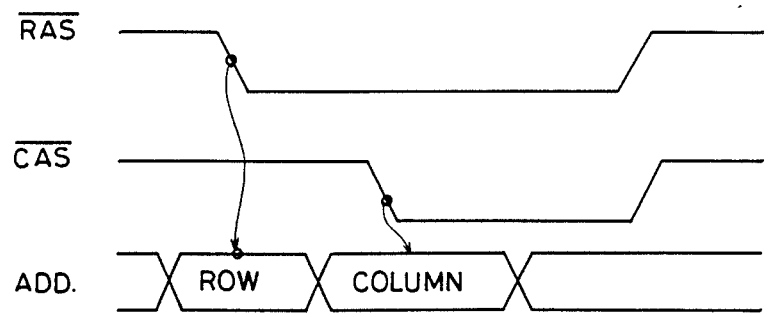
FIG. 2 is a timing chart showing timing of accepting an address signal in the semiconductor memory device shown in FIG. 1.
Figure 3:
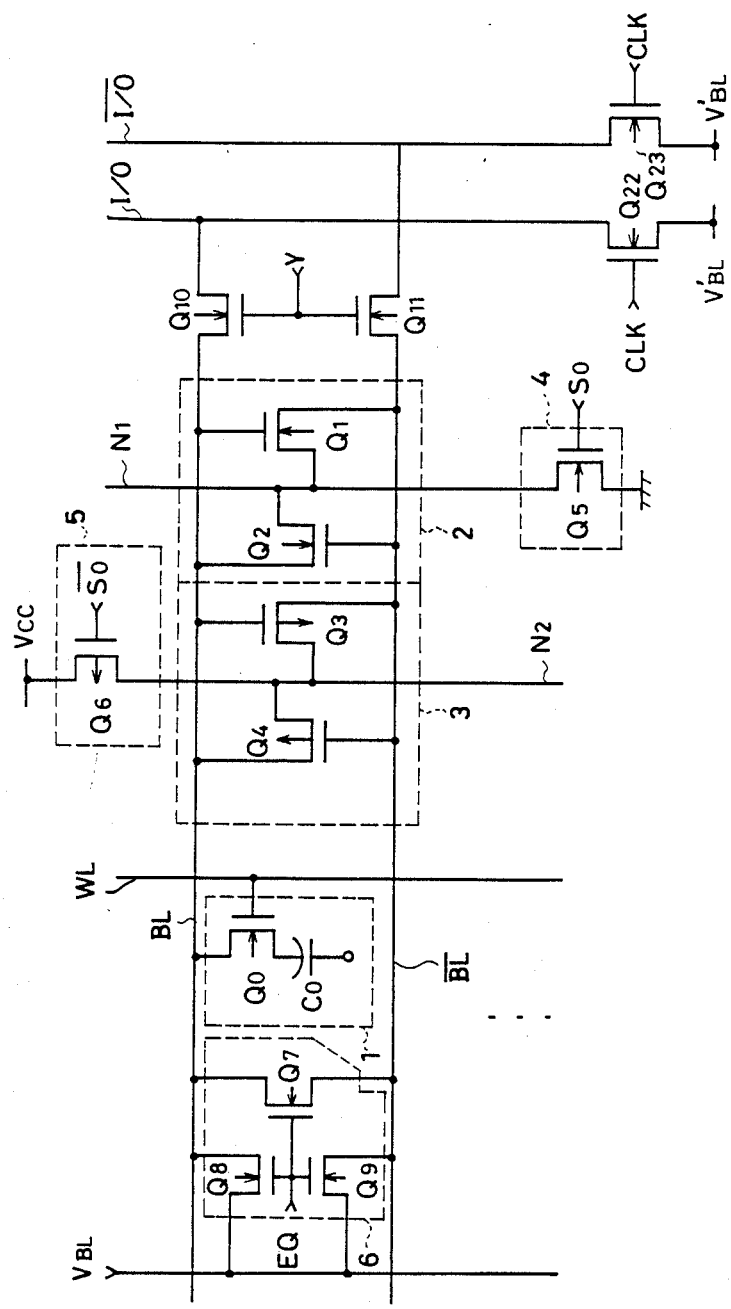
FIG. 3 is a circuit diagram showing a structure of a main part of, the conventional semiconductor memory device.
Figure 4:
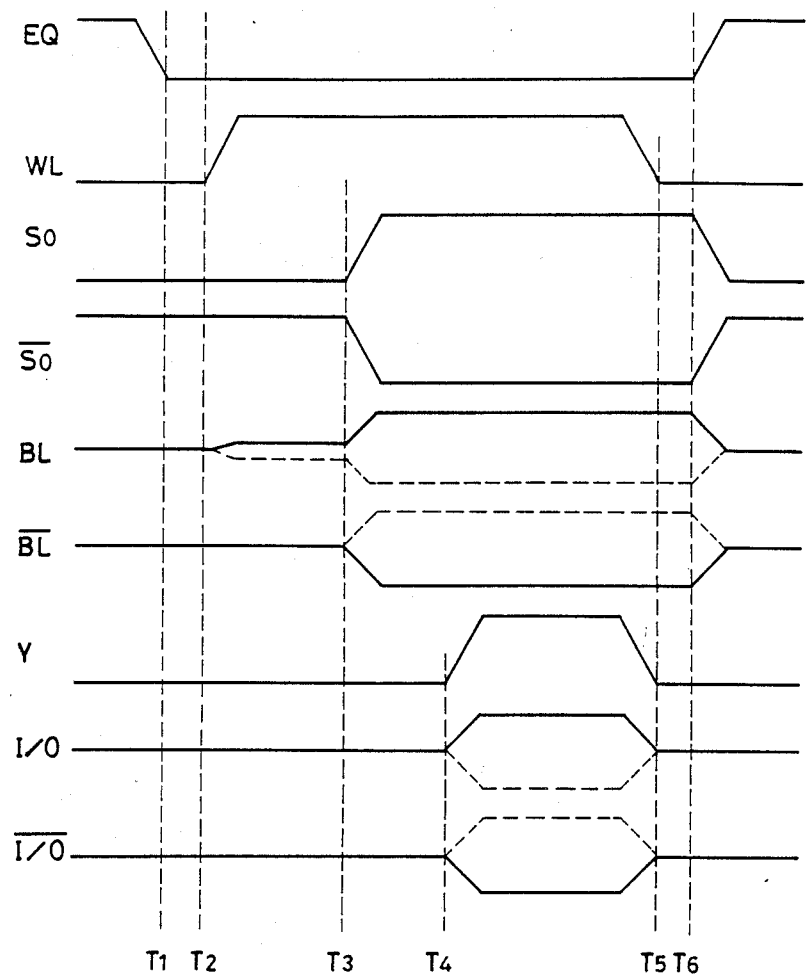
FIG. 4 is a timing chart for explaining an operation of the semiconductor memory device shown in FIG. 3.
Figure 5:
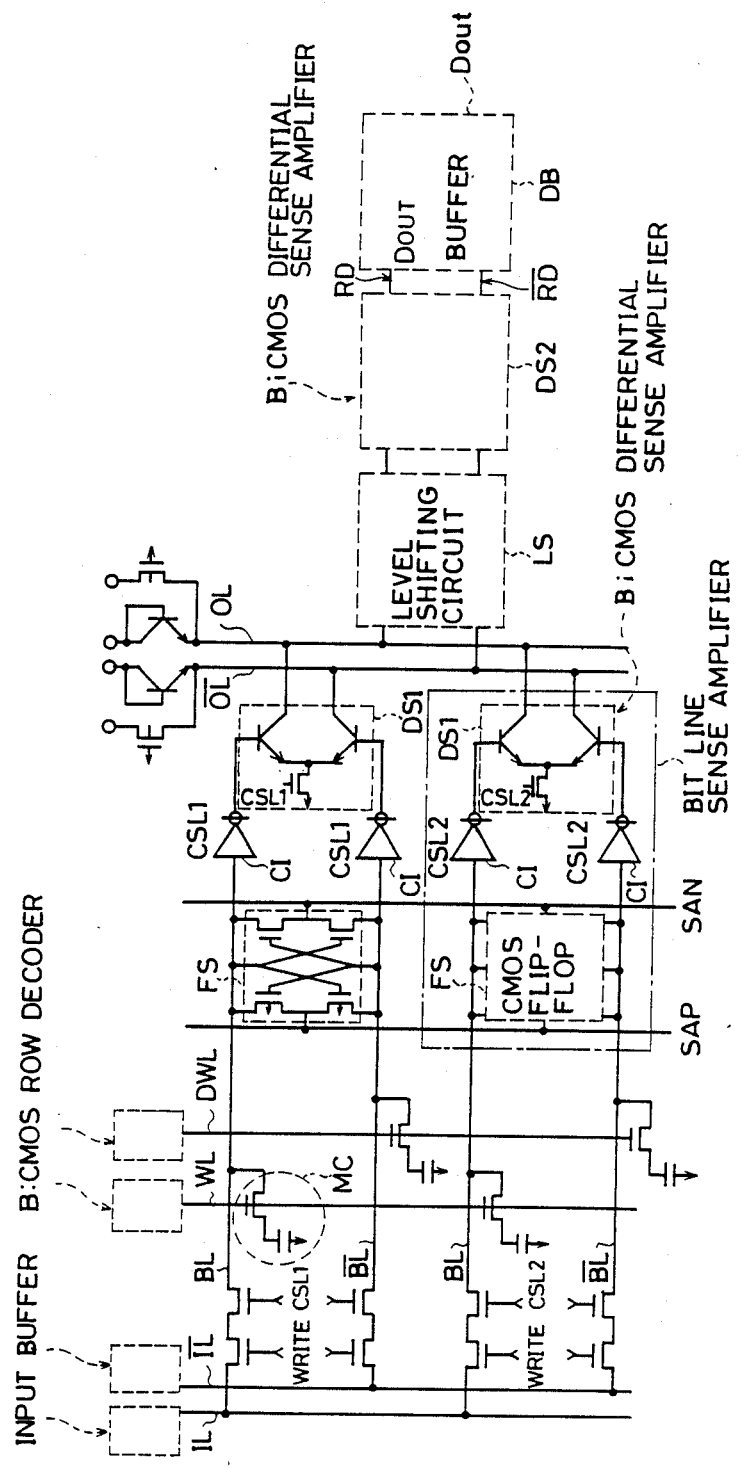
FIG. 5 is a circuit diagram showing a structure of a main part of another conventional semiconductor memory device.
Figure 6:
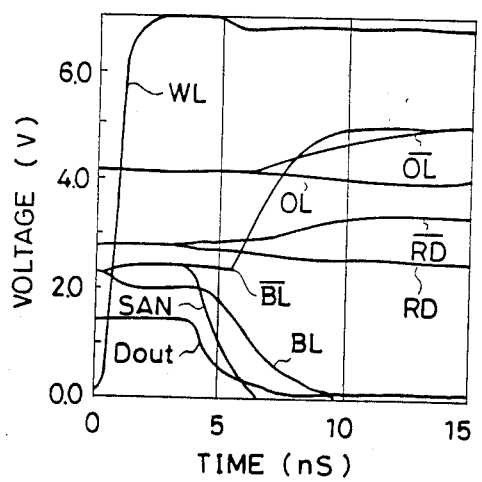
FIG. 6 is a waveform diagram showing the change in voltage of each portion of the semiconductor memory device shown in FIG. 5.
Figure 7:
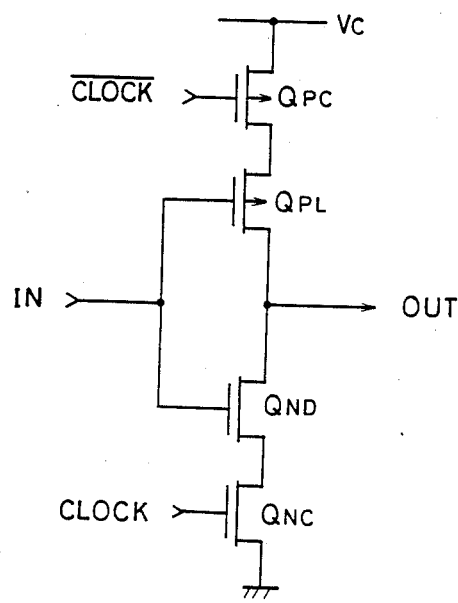
FIG. 7 is a circuit diagram showing a structure of a clocked inverter.

Advantages of the current-mirror type amplifier 30 used in the semiconductor memory device shown in FIG. 8 are now described while making a comparison with a simple differential sense amplifier used in the prior art shown in FIG. 5.

The prior art shown in FIG. 5 employs a BiCMOS differential sense amplifier taking advantage of high drivability (or current carrying capability) and high sensitivity to small signals of a bipolar differential sense amplifier. However, since a bipolar transistor has a small input impedance, an input of the bipolar differential sense amplifier can not be directly connected to a bit line without adversely affecting a small signal voltage appearing on the bit line before activation of a conventional flip-flop type sense amplifier. Thus, in the prior art shown in FIG. 5, a clocked inverter is provided between the bit line and the input of the BiCMOS differential sense amplifier. As a result, there occurs delay in signal transmission from the bit line to the BiCMOS differential sense amplifier and the occupied area becomes larger, which is disadvantageous in high integration density of the memory device.

On the other hand, in the semiconductor memory device shown in FIG. 8, CMOS transistors, for example, are employed for the amplifier for read-out data. A MOS transistor has a gate oxide film electrically insulating a gate electrode from a source and a drain. Therefore, when the gate electrode of the MOS transistor is employed as an input gate, the MOS transistor provides a high input impedance. Thus, means for providing a high input impedance are not required at all in the semiconductor memory device shown in FIG. 8 because the CMOS differential amplifier inherently has a high input impedance. As a result, the disadvantages of the prior art can be eliminated.

Additionally, the current-mirror type sense amplifier in the semiconductor memory device shown in FIG. 8 has a kind of positive feedback caused by mirroring the current between the two inverters. Therefore, the amplifying speed can be improved over the simple differential sense amplifier.

Figure 10A:
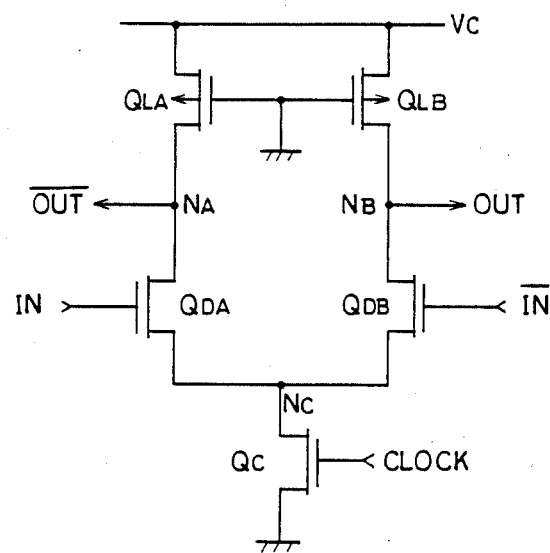
FIG. 10A is a circuit diagram showing a structure of a conventional differential sense amplifier.
Figure 10B:
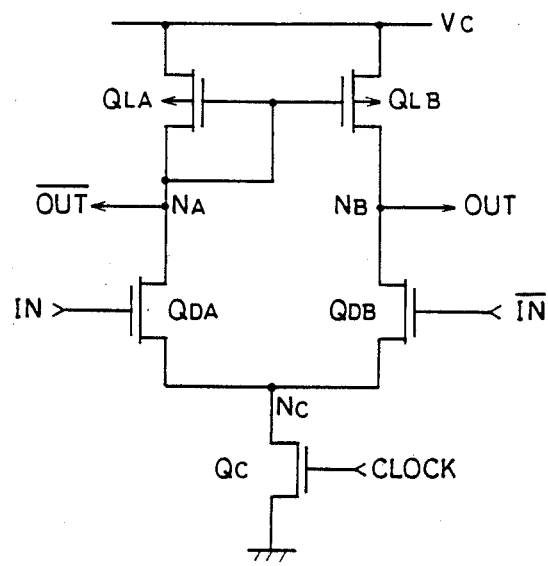
FIG. 10B is a circuit diagram showing a structure of a current-mirror type amplifier employed in the present invention.

FIG. 10A is a circuit diagram of a conventional simple differential sense amplifier, and FIG. 10B is a circuit diagram of a current-mirror type differential amplifier. For easier comparison, FIG. 10A shows a differential sense amplifier comprising MOS transistors instead of the BiCMOS transistors.

The differential sense amplifier shown in FIG. 10 comprises two inverters and an activation transistor $Q_C$ provided between the two inverters and a ground potential. One of the inverters comprises an N channel driver MOS transistor $Q_{DA}$ and a P channel load MOS transistor $Q_{LA}$. The other inverter comprises an N channel driver MOS transistor $Q_{DB}$ and a P channel load MOS transistor $Q_{LB}$. Data outputs OUT and $\overline{OUT}$ are respectively provided from nodes $N_A$ and $N_B$. The nodes $N_A$ and $N_B$ are precharged at a high level through the transistors $Q_{LA}$ and $Q_{LB}$.

When a signal CLOCK becomes a high level, the activation transistor $Q_C$ is turned on. Therefore, a potential of the node $N_C$ is lowered, so that the two inverters $Q_{LA}/Q_{DA}$ and $Q_{LB}/Q_{DB}$ are activated. On this occasion, the driver transistors $Q_{DA}$ and $Q_{DB}$ provide different impedances depending on input signals IN and $\overline{IN}$. As a result, potentials of the nodes $N_A$ and $N_B$ are respectively changed to a given level according to the impedances of the driver transistors $Q_{DA}$ and $Q_{DB}$. More specifically, the data outputs OUT and $\overline{OUT}$ are changed independently. The voltage difference between the data outputs OUT and $\overline{OUT}$ is caused only by the voltage difference between the input signals IN and $\overline{IN}$ and hence, is not so large. Thus, in the prior art of FIG. 5, a level shifting circuit and another differential sense amplifier are provided in order to considerably amplify the voltage difference between the data outputs OUT and $\overline{OUT}$.

On the contrary, a current-mirror type amplifier shown in FIG. 10B comprises the same transistors as those in the differential sense amplifier shown in FIG. 10A, gates of load transistors $Q_{LA}$ and $Q_{LB}$ being connected to a node $N_A$ instead of a ground terminal. In such a configuration, the level of a node $N_B$ is adjusted by the level of the node $N_A$. For example, when the level of an input signal IN is higher than that of an input signal $\overline{IN}$, a transistor $Q_{DA}$ becomes more conductive than the transistor $Q_{DB}$. Therefore, a potential of the node $N_A$ is pulled down to a low level. Consequently, the load transistor $Q_{LB}$ is rendered more conductive. As a result, a potential of the node $N_B$ is pulled up more quickly than the differential sense amplifier shown in FIG. 10A. Such an operation is a kind of positive feedback between two outputs OUT and $\overline{OUT}$.

Figure 11A:
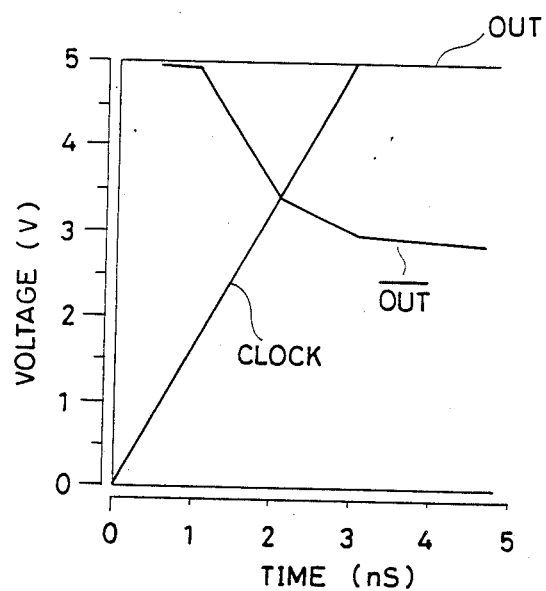
FIG. 11A is a diagram showing output characteristics of the differential sense amplifier shown in FIG. 10A.
Figure 11B:
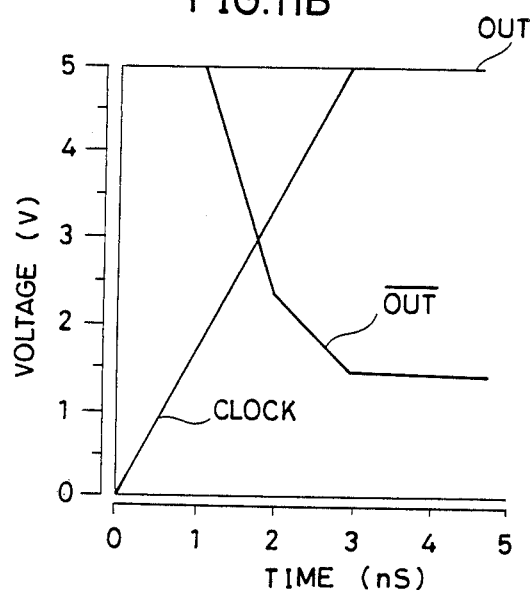
FIG. 11B is a diagram showing output characteristics of the current-mirror type amplifier shown in FIG. 10B.

FIG. 11A shows one example of output characteristics of the differential sense amplifier shown in FIG. 10A, and FIG. 11B shows one example of output characteristics of the current-mirror type amplifier shown in FIG. 10B. The characteristics are obtained by circuit simulation using the same parameter.

As clear from FIGS. 11A and 11B, the current-mirror type amplifier is more advantageous over the simple differential sense amplifier in the operation speed, because the current-mirror type amplifier provides a larger differential signal voltage than that of the simple differential sense amplifier within a constant time period after activation.

However, in the semiconductor memory device shown in FIG. 8, there exists a node which is rendered electrically floating in a given period. More specifically, a node N3 of the transistors Q10 and Q11 and a node N4 of the transistors Q11 and Q13 are rendered electrically floating when the transistors Q10 to Q13 are turned off. In addition, a node N5 of the transistors Q16 and Q18 and a node N6 of the transistors Q17 and Q19 are rendered electrically floating when the transistors Q16 to Q19 are turned off. The existence of the nodes N3 to N6 may cause the following disadvantages.

Figures 12, 13:
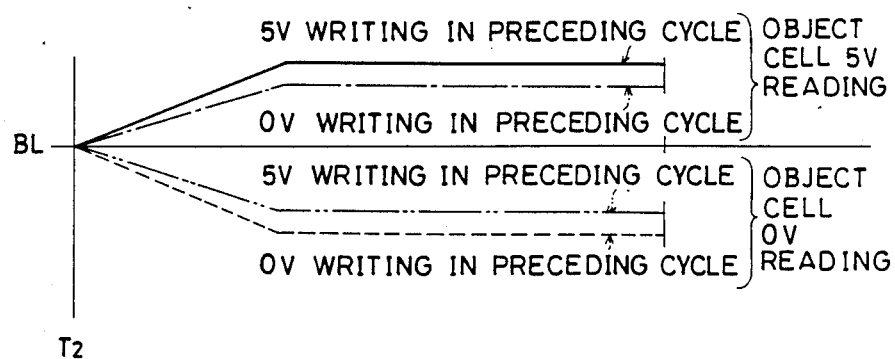
FIG. 12 is a diagram for explaining the effect of a node in the preceding cycle in the semiconductor memory device shown in FIG. 8.
FIG. 13 is a diagram for explaining the effect of a potential on a bit line in the preceding cycle in the semiconductor memory device shown in FIG. 8.

For example, it is assumed that in the preceding cycle, 0V, i.e., data "0" is written in the memory cell 1 connected to the bit line BL. In this case, the node N3 becomes 0V and the node N4 becomes 5V. Since the transistor Q10 to Q13 are turned off after writing is terminated, the nodes N3 and N4 are rendered electrically floating with they being respectively held at 0V and 5V, as shown in FIG. 12. Then, it is assumed that in the present cycle, data is read out of another memory cell 1 (the currently selected memory cell is referred to as an object cell hereinafter) connected to the bit line BL. In this case, a reading operation to occur when data "1" is stored in the object cell is referred to as 5V reading, while a reading operation to occur when data "0" is stored therein is referred to as 0V reading.

When 5V reading is performed with respect to the object cell, the potential on the bit line BL is raised by a slight potential difference $\Delta V_{BL}$ from $\frac{1}{2}\cdot Vcc$ level while the potential on the bit line $\overline{BL}$ remains at the $\frac{1}{2}$ Vcc level. When the column decoded signal Y is raised to a high level, the nodes N3 and N4 are respectively connected to the bit lines BL and $\overline{BL}$. On this occasion, since the node N3 is at 0V, the potential on the bit line BL becomes lower than ($\frac{1}{2}\cdot Vcc + \Delta V_{BL}$). In addition, since the node N4 is at 5V, the potential on the bit line $\overline{BL}$ becomes higher than $\frac{1}{2}\cdot Vcc$. On the contrary, when 0V reading is performed, the potential on the bit line BL becomes lower than ($\frac{1}{2}\cdot Vcc - \Delta V_{BL}$) while the potential on the bit line $\overline{BL}$ becomes higher than $\frac{1}{2}\cdot Vcc$ by the effect of the nodes N3 and N4.

On the other hand, when performing 0V writing, i.e., writing of data "1" in the preceding cycle, the nodes N3 and N4 are rendered electrically floating with they being respectively held at 5V and 0V. Therefore, if 5V reading is performed in the present cycle, the potential on the bit line BL becomes higher than ($\frac{1}{2}\cdot Vcc + \Delta V_{BL}$) while the potential on the bit line $\overline{BL}$ becomes lower than $\frac{1}{2}\cdot Vcc$, as shown in FIG. 12. On the contrary, when 0V reading is performed in the present cycle, the potential on the bit line BL becomes higher than ($\frac{1}{2}\cdot Vcc - \Delta V_{BL}$) while the potential on the bit line $\overline{BL}$ becomes lower than $\frac{1}{2}\cdot Vcc$, as shown in FIG. 12.

More specifically, as show: in FIG. 13, the potential on the bit line BL at the time of reading in the present cycle varies depending on whether 5V writing or 0V writing is performed in the preceding cycle. Therefore, a malfunction may occur in the present cycle depending on the state of the preceding cycle.

It is assumed for the purpose of illustration that in the preceding cycle, 0V reading is performed with respect to, for example, a given memory cell 1 (the previously selected memory cell is referred to as a preceding cell hereinafter) connected to the bit line BL. In this case, when the column decoded signal Y is raised to a high level, the node N5 becomes 5V and the node N6 becomes 0V (see FIG. 14). When the column decoded signal Y is lowered to a low level after the reading operation is terminated, the nodes N5 and N6 are rendered electrically floating with they being respectively held at 5V and 0V. If and when 0V reading is performed with respect to another memory cell 1 (object cell) in the present cycle, the nodes N5 and N6 respectively remain at 5V and 0V. However, if 5V reading is performed with respect to the object cell in the present cycle, the node N5 is changed from 5V to 0V while the node N6 is changed from 0V to 5V. Thus, in FIG. 14, there occurs a difference in operation time between the operation from (1) to (2) and the operation (1) to (3).

Thus, when there occurs a difference in operation time in the present cycle depending on the state of the preceding cycle, the operation becomes unstable, so that a malfunction may occur depending on the condition of use. Therefore, inconvenience appears in the design and the use. In addition, it is difficult to consider variations in operation time at the time of testing a device. Therefore, further enhancement of a semiconductor memory device is provided as shown in the following embodiment.

Figure 15:
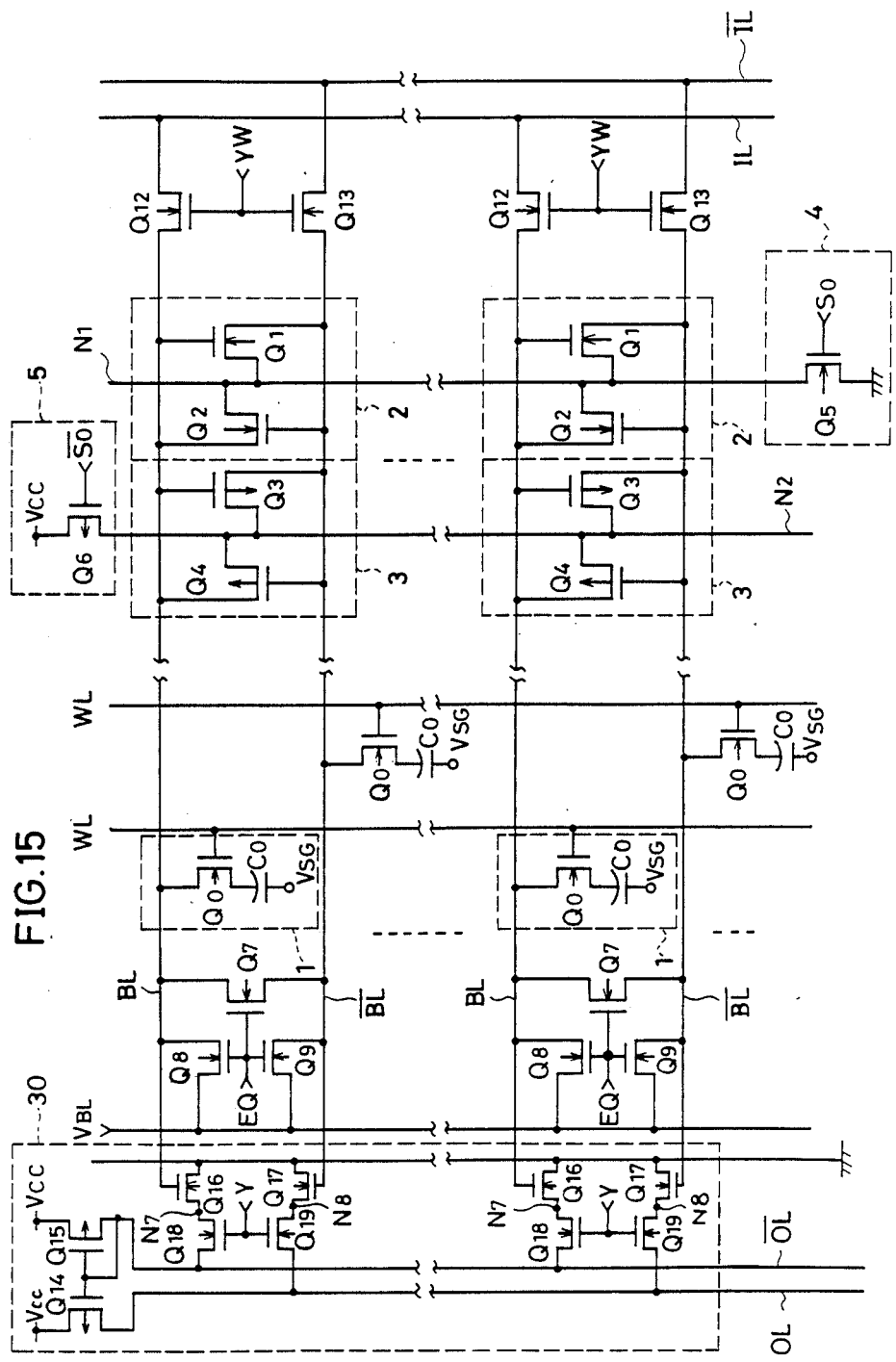
FIG. 15 is a circuit diagram showing a structure of a main part of a semiconductor memory device according to one embodiment of the present invention.

FIG. 15 is a circuit diagram showing a structure of a main part of a semiconductor memory device according to one embodiment of the present invention.

The semiconductor memory device shown in FIG. 15 differs from the semiconductor memory device shown in FIG. 8 in the following. First, only N channel MIS transistors Q12 and Q13 are respectively connected between bit lines BL and $\overline{BL}$ and between write-in data transferring lines IL and $\overline{IL}$. The transistors Q12 and Q13 have their gates receiving a write-in column decoded signal YW. The write-in column decoded signal YW is obtained by ANDing a column decoded signal Y with a write-in instruction signal W. In addition, in a current-mirror type amplifier 30, an N channel MIS transistor Q16 is coupled between a ground potential and a node N7, and an N channel MIS transistor Q17 is coupled between the ground potential and a node N8. The transistors Q16 and Q17 have their gates respectively connected to the bit lines BL and $\overline{BL}$. An N channel MIS transistor Q18 is connected between the node N7 and a read-out data transferring line $\overline{OL}$, and an N channel MIS transistor Q19 is connected between the node N8 and a read-out data transferring line OL. The transistors Q18 and Q19 have their gates receiving the column decoded signal Y. A structure of the other portions are the same as that shown in FIG. 8.

Figure 16:
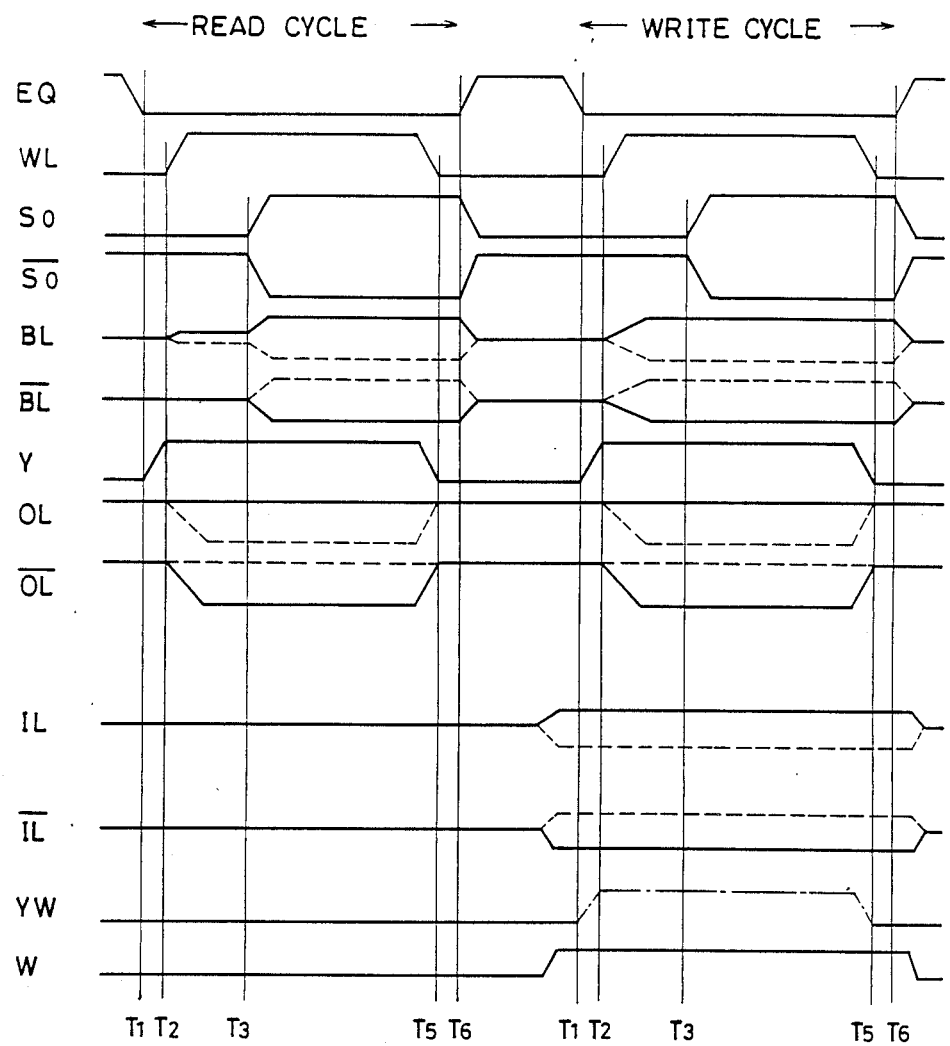
FIG. 16 is a timing chart for explaining a reading operation and a writing operation of the semiconductor memory device shown in FIG. 15.

Referring now to a timing chart of FIG. 16, description is made of an operation of the semiconductor memory device shown in FIG. 15.

In a read cycle, before the time T1, an equalizing signal EQ is at a high level and the bit lines BL and $\overline{BL}$ are precharged at a precharge potential $V_{BL}$ ($\frac{1}{2}$·Vcc level) through transistors Q7 to Q9. Therefore, the transistors Q16 and Q17 are turned on so that the nodes N7 and N8 are at the ground potential.

At the time T1, when the equalizing signal EQ is lowered to a low level, the bit lines BL and $\overline{BL}$ are rendered electrically floating. In addition, when the column decoded signal Y is raised to a high level, the transistors Q18 and Q19 are turned on, so that the current-mirror type amplifier 30 is activated. On this occasion, the write-in column decoded signal YW remains at a low level. Thus, the transistors Q12 and Q13 remains off.

At the time T2, when a potential on a selected word line WL is raised to a high level, information stored in a memory cell 1 is read out to the bit line BL. If data "1" is stored in the memory cell 1, a potential on the bit line BL is slightly raised as compared with the precharge potential, as represented by solid lines in FIG. 16, so that the potential on the bit line BL is held at the precharge potential. This change in the potential on the bit line is amplified by the current-mirror type amplifier 30 at high speed, to be outputted to the read-out data transferring lines OL and $\overline{OL}$. In this case, the read-out data transferring line $\overline{OL}$ is discharged through the transistors Q18 and Q16 at high speed such that a potential thereon becomes the ground potential. On the other hand, a potential on the read-out data transferring line OL remains at the precharge potential.

In this embodiment, the bit line pair BL and $\overline{BL}$ is not directly connected to the read-out data transferring lines OL and $\overline{OL}$. Thus, load capacitances of the read-out data transferring lines OL and $\overline{OL}$ and potential levels thereof do not affect at all the potentials on the bit lines BL and $\overline{BL}$. In addition, since the write-in data transferring lines IL and $\overline{IL}$ are disconnected from the bit lines BL and $\overline{BL}$ by the transistors Q12 and Q13, load capacitances of the write-in data transferring lines IL and $\overline{IL}$ do not affect at all signal potentials on the bit lines BL and $\overline{BL}$. Thus, immediately after the rise of the potential on the word line, a very small potential difference between the bit lines BL and $\overline{BL}$ is detected by the current-mirror type amplifier 30, so that information is read out precisely and at high speed.

At the time T3, sense amplifiers 2 and 3 are activated in response to sense amplifier activation signals SO and $\overline{SO}$, so that a very small potential difference between signals on the bit lines BL and $\overline{BL}$ is further increased. Therefore, information is rewritten into the memory cell 1 connected to the selected word line WL.

At the time T5, when the potential on the word line WL and the column decoded signal Y is lowered to a low level, the current-mirror type amplifier 30 is rendered inactive. Consequently, the read-out data transferring lines OL and $\overline{OL}$ are charged through transistors Q14 and Q15 such that the potentials thereon become a power-supply potential Vcc.

At the time T6, when the sense amplifier activation signals SO and $\overline{SO}$ are brought to an inactive state, the sense amplifiers 2 and 3 responsively enter the inactive state. At the same time, the equalizing signal EQ is raised to a high level, so that the bit lines BL and $\overline{BL}$ are precharged at the precharge potential $V_{BL}$ through the transistors Q7 to Q9.

Although description was made on a case in which the selected memory cell 1 stores information "1", the selected memory cell 1 may store information "0", in which case a signal waveform as represented by dotted lines in FIG. 16 is obtained.

In a write cycle, the write-in instruction signal W becomes a high level. At that time, external write data are transferred to the write-in data transferring lines IL and $\overline{IL}$ from a write-in circuit in a complementary manner (for example, "1" and "0").

At the time T1, the equalizing signal EQ is lowered to a low level and then, the column decoded signal Y is raised to a high level. Consequently, at the same time, the write-in column decoded signal YW is raised to a high level, so that the transistors Q12 and Q13 are turned on. Therefore, the write-in data transferring lines IL and $\overline{IL}$ are respectively connected to the bit lines BL and $\overline{BL}$, so that the potential on the bit line BL is raised to the power-supply potential Vcc while the potential on the bit line $\overline{BL}$ is lowered to the ground potential.

At the time T3, the sense amplifiers 2 and 3 are activated in response to the sense amplifier activation signals SO and $\overline{SO}$. At the time T5, the potential on the word line WL, the column decoded signal Y and the write-in column decoded signal YL are lowered to a low level. Consequently, data "1" is written into the selected memory cell 1.

At the time T6, the sense amplifiers 2 and 3 are rendered inactive in response to the sense amplifier activation signals SO and $\overline{SO}$. At the same time, the equalizing signal EQ is raised to a high level, so that the bit lines BL and $\overline{BL}$ are precharged again at the precharge potential $V_{BL}$ through the transistors Q7 to Q9. Thereafter, the write-in instruction signal W is lowered to a low level, so that the write-in data transferring lines IL and $\overline{IL}$ are precharged at a predetermined potential.

In summary, in the semiconductor memory device shown in FIG. 15, the nodes N3 and N4 of the semiconductor memory device shown in FIG. 8 can be avoided by performing the AND function of Y+W. Thus, the reading operation in the present cycle is not affected by the writing operation in the preceding cycle.

Also, as shown in FIG. 14, the nodes N7 and N8 of FIG. 15 corresponding respectively to nodes N5 and N6 of FIG. 8 in the current-mirror type amplifier 30 are discharged through the transistors Q16 and Q17 in an equalizing period before the read cycle so that the potentials thereof become 0V. Thus, when 0V reading is performed with respect to the object cell in the present cycle, the node N7 is changed from 0V to 5V while the node N8 remains at 0V. On the other hand, when 5V reading is performed with respect to the object cell in the present cycle, the node N7 remains at 0V while the node N8 is changed from 0V to 5V. More specifically, in FIG. 14, the times required for the operation from (1) to (2) and the the operation (1) to (3) become equal. Also the effects of noises received by the nodes N7 and N8 from other portions are equalized. Therefore, the operation in the present cycle is not affected by the operation in the preceding cycle so that the operation is stabilized. Thus, a malfunction is avoided depending on the condition of use.

Figure 17:
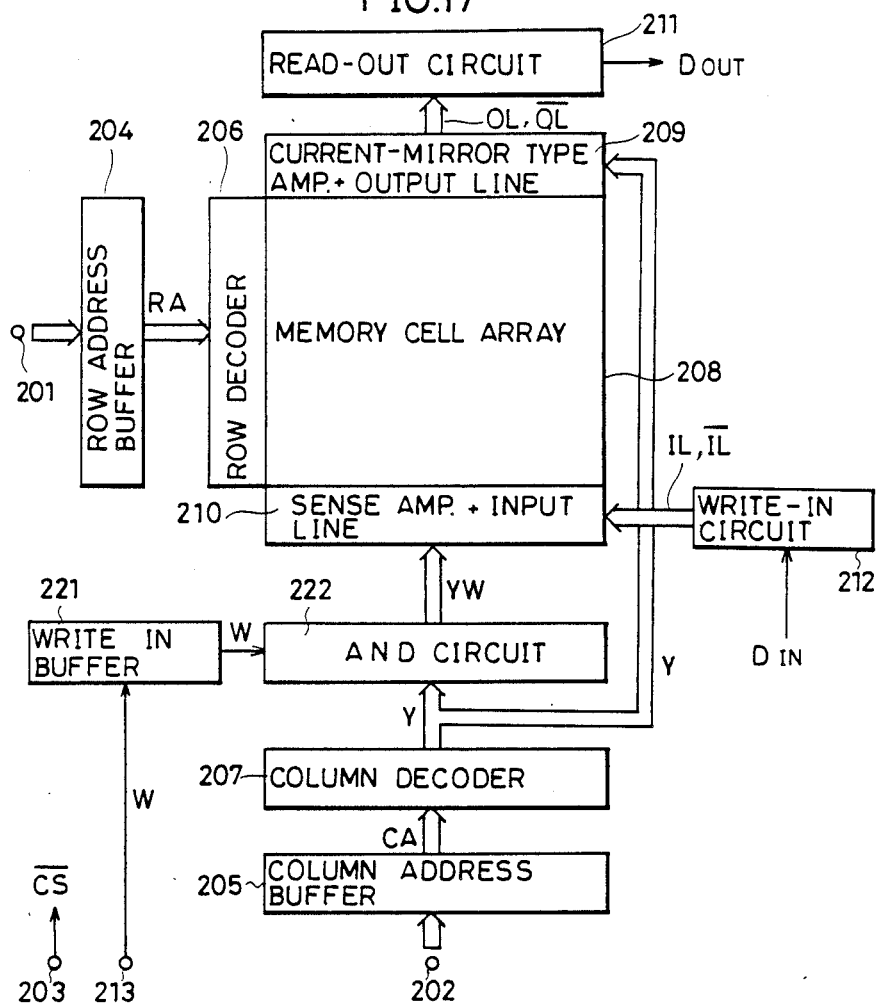
FIG. 17 is a block diagram showing one example of an entire structure of the semiconductor memory device shown in FIG. 15.
Figure 18:
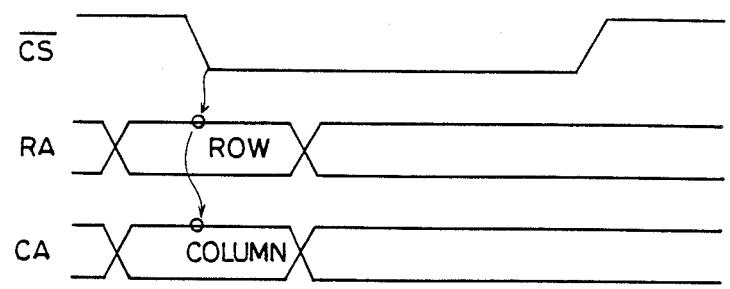
FIG. 18 is a timing chart showing timing of accepting an address signal in the semiconductor memory device shown in FIG. 17.

FIG. 17 is a block diagram showing one example of an entire structure of the semiconductor memory device shown in FIG. 15.

In FIG. 17, a row address input terminal 201 and a column address input terminal 202 are separately provided, a row address signal and a column address signal being respectively applied to a row address buffer 204 and a column address buffer 205 through the terminals. The row address buffer 204 and the column address buffer 205 are responsive to a chip select signal $\overline{CS}$ for accepting an internal row address signal RA and an internal column address signal CA respectively externally applied. A row decoder 206 is responsive to the internal row address signal RA for selecting a single word line out of a memory cell array 208. A column decoder 207 is responsive to the internal column address signal $\overline{CA}$ for generating a column decoded signal Y to apply the same to a (current-mirror type amplifier-+output line) block 209 and an AND circuit 222.

On the other hand, a write-in buffer 221 applies to the AND circuit 222 a write-in instruction signal W applied to a write-in terminal 213. The AND circuit 222 ANDs a column decoded signal Y with the write-in instruction signal W, to apply the same to a (sense amplifier+input line) block 210 as a write-in column decoded signal YW.

Data read out from the (current-mirror type amplifier+output line) block 209 is outputted through a read-out circuit 211 as output data $D_{OUT}$. On the other hand, write-in data $D_{IN}$ is applied to the (sense amplifier+input line) block 210 through a write-in circuit 212.

In the structure shown in FIG. 17, since the row address signal and the column address signal are simultaneously accepted at timings of the fall of the chip select signal $\overline{CS}$, to be applied to the row decoder 206 and the column decoder 207, the speed of a reading operation can be increased by early activation of the current-mirror type amplifier.

Figure 17A:
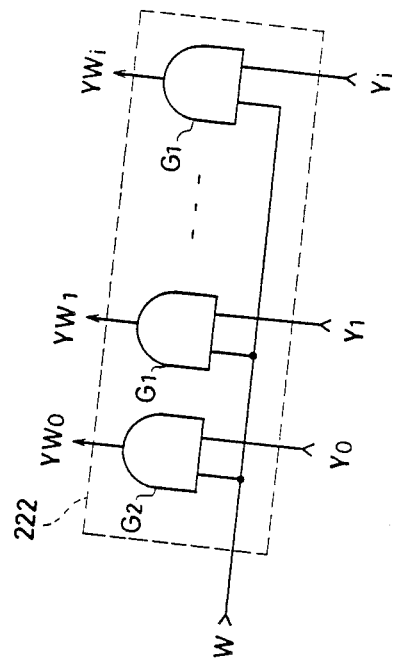
FIG. 17A is a circuit diagram showing a structure of an AND circuit shown in FIG. 17.

As shown in FIG. 17A, the AND circuit 222 comprises a plurality of AND gates G1. A write-in instruction signal W is applied to one input terminal of each of the AND gates G1, and column decoded signals $Y_0$ to $Y_i$ are respectively applied to the other input terminals thereof. Write-in column decoded signals $YW_0$ to $YW_i$ are respectively outputted from output terminals of the AND gates G1. In the other drawings, the column decoded signals $Y_0$ to $Y_i$ and the write-in column decoded signals $YW_0$ to $YW_i$ are simply described as column decoded signals Y and write-in column decoded signals YW, respectively.

Figure 19:
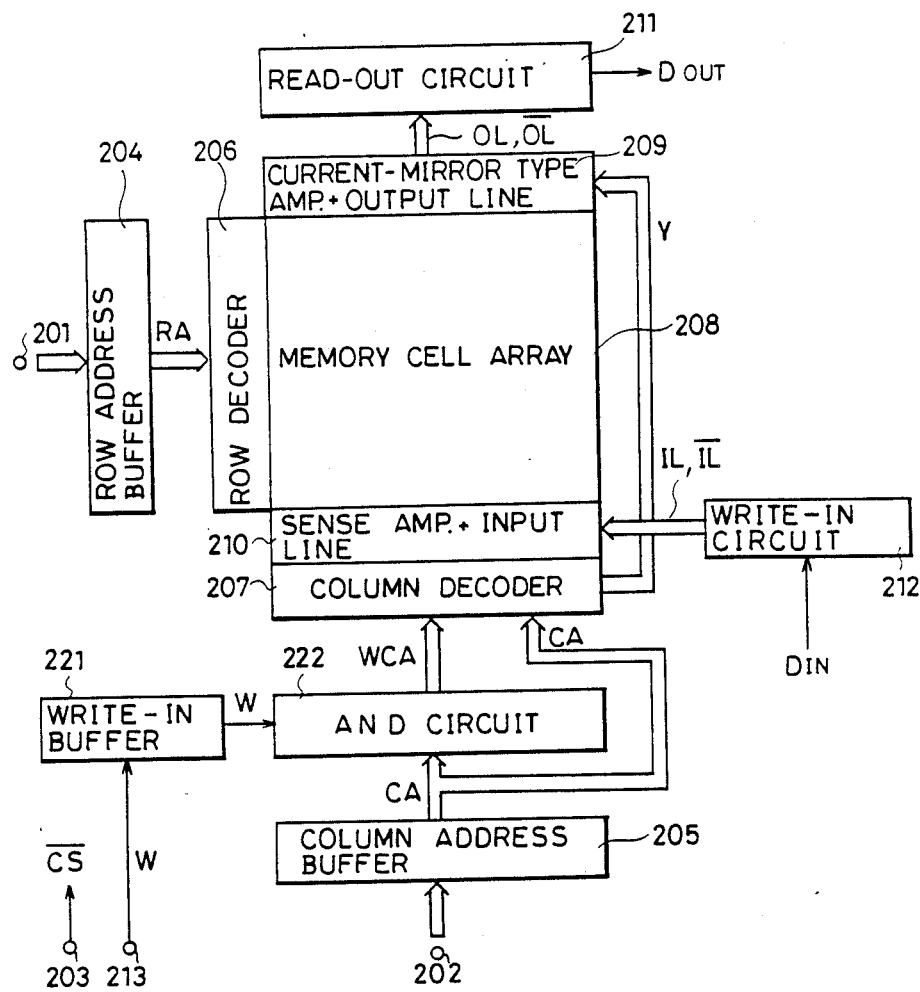
FIG. 19 is a block diagram showing another example of an entire structure of the semiconductor memory device shown in FIG. 15.

FIG. 19 is a block diagram showing another example of an entire structure of the semiconductor memory device shown in FIG. 15.

In this embodiment, an address signal applied to a column address input terminal 202 is inputted to a column decoder 207 and an AND circuit 222 through a column address buffer 205. In addition, a write-in instruction signal W applied to a write-in terminal 213 is applied to the AND circuit 222 through a write-in buffer 221. The AND circuit 222 applies to the column decoder 207 a signal WCA obtained by ANDing an internal column address signal CA with the write-in instruction signal W. The column decoder 207 is responsive to the signal WCA for applying a write-in column decoded signal YW (not shown) to a (sense amplifier+input line) block 210.

Figure 20:
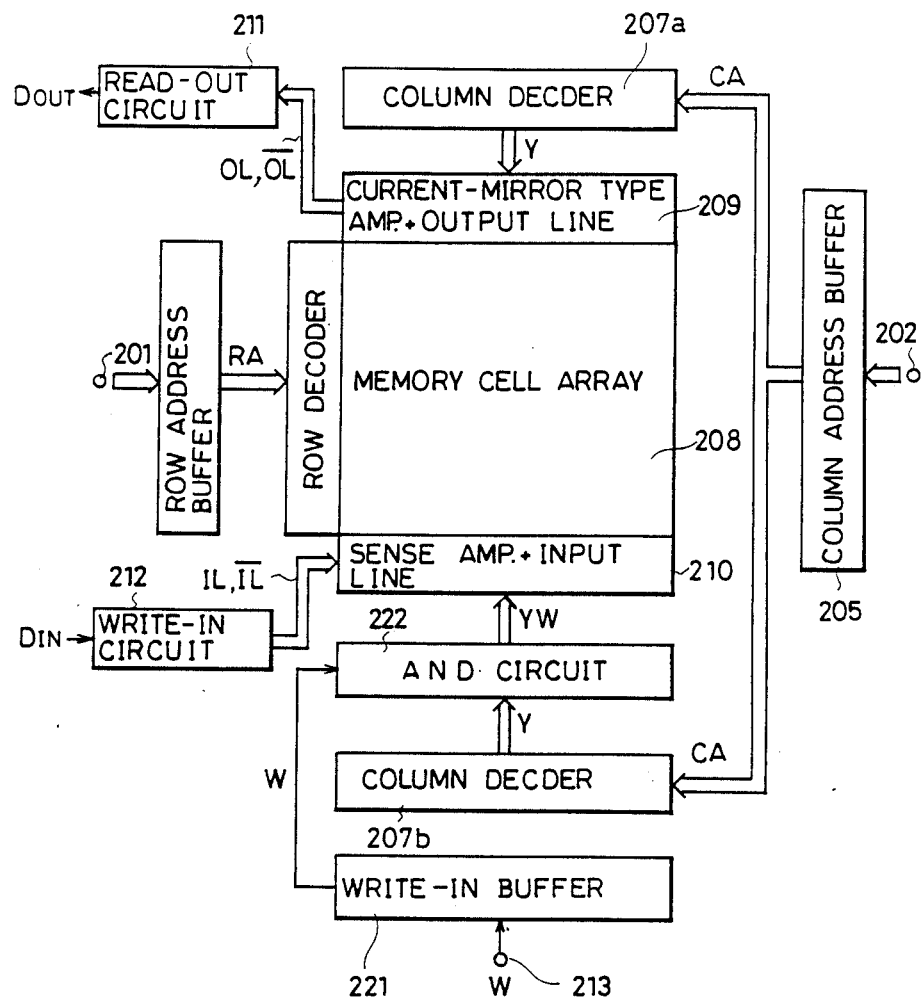
FIG. 20 is a block diagram showing still another example of the entire structure of the semiconductor memory device shown in FIG. 15.

FIG. 20 is a block diagram showing still another example of the entire structure the semiconductor memory device shown in FIG. 15.

In this embodiment, there are provided two column decoders 207a and 207b. An address signal applied to a column address input terminal 202 is applied to the column decoders 207a and 207b through a column address buffer 205. The column decoder 207a is responsive to an internal column address signal CA for generating a column decoded signal Y to apply the same to a (current-mirror type amplifier+output line) block 209. On the other hand, the column decoder 207b is responsive to an internal column address signal CA for generating a column decoded signal Y to apply the same to an AND circuit 222. A write-in instruction signal W applied to a write-in terminal 213 is applied to the AND circuit 222 through a write-in buffer 221. The AND circuit 222 ANDs the column decoded signal Y with the write-in instruction signal W, to apply the result to a (sense amplifier+input line) block 210 as a write-in column decoded signal YW.

In this embodiment, the two column decoders 207a and 207b are provided. It becomes easy to interconnect the column decoded signal Y applied from the column decoder 207a to the (current-mirror type amplifier+output line) block 209.

However, in the read cycle of the semiconductor memory device shown in FIG. 15, certain degree of time required until the current-mirror type amplifier 30 amplifies a very small potential difference appearing on the bit lines BL and $\overline{BL}$, to output data at a considerable level to the read-out data transferring lines OL and $\overline{OL}$. More specifically, there exists a delay factor of access time at the time of reading.

Additionally, in the semiconductor memory device shown in FIG. 15, the current-mirror type amplifier 30 is activated in response to the column decoded signal Y, so that the current-mirror type amplifier 30 is activated at the time other than the time of reading. Therefore, unnecessary current flows between the power-supply potential Vcc and the ground potential Vss through the transistors Q15, Q18 and Q16.

To avoid these characteristics, a semiconductor memory device according to a further embodiment of the invention is described below.

Figure 21:
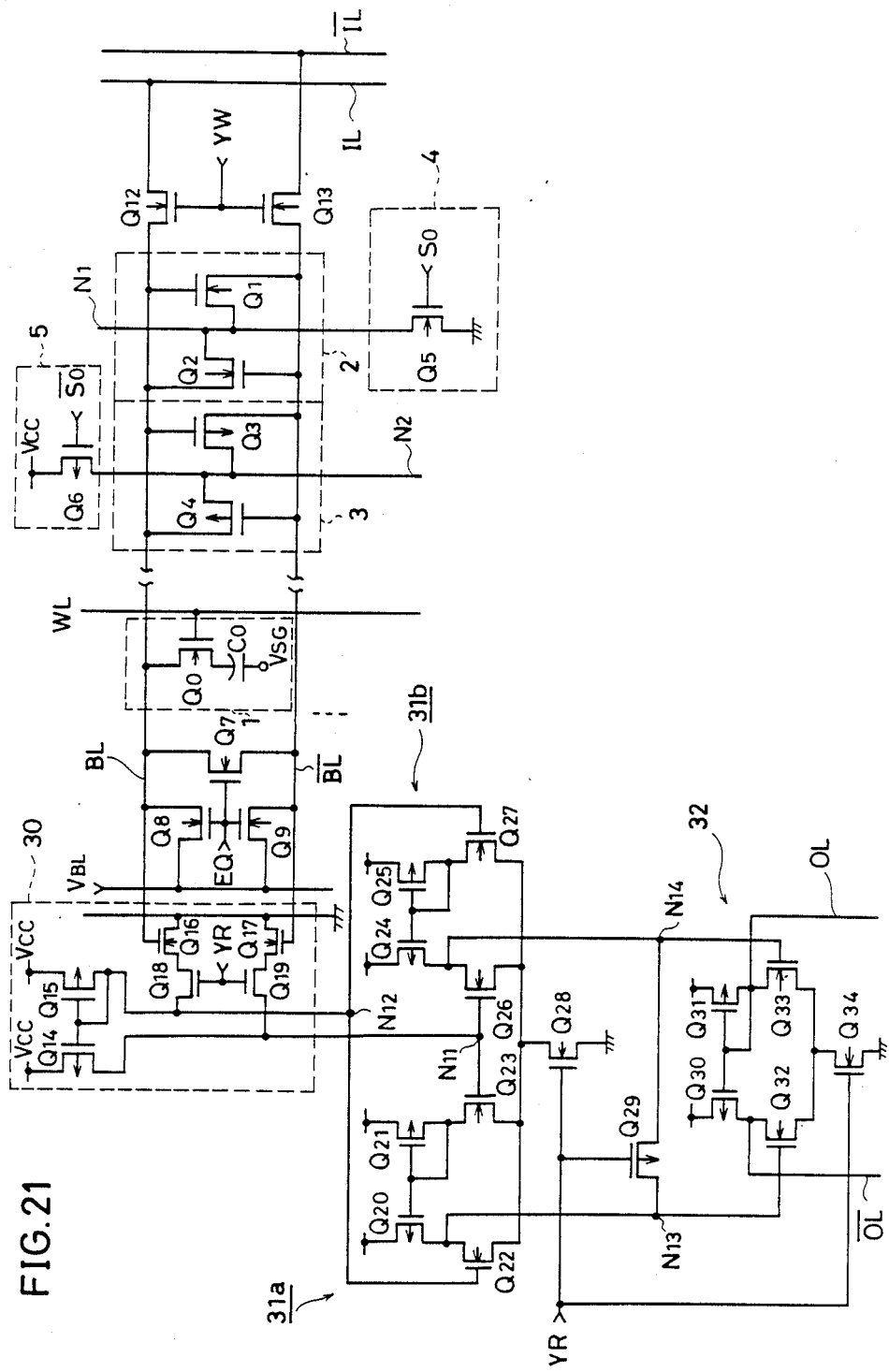
FIG. 21 is a circuit diagram showing a structure of a main part of a semiconductor memory device according to another embodiment of the present invention.

Accordingly, FIG. 21 is a circuit diagram showing a structure of a main part of a semiconductor memory device according to this further embodiment of the present invention.

The semiconductor memory device shown in FIG. 21 differs from the semiconductor memory device shown in FIG. 15 in the following. Two second current-mirror type amplifiers 31a and 31b are connected to output nodes N11 and N12 of a first current-mirror type amplifier 30. A third current-mirror type amplifier 32 is connected to an output node N13 of the second current-mirror type amplifier 31a and a node N14 of the second current-mirror type amplifier 31b. Read-out data transferring lines OL and $\overline{OL}$ constitute an output node of the third current-mirror type amplifier 32.

The second current-mirror type amplifier 31a comprises P channel MIS transistors Q20 and Q21 and N channel MIS transistors Q22 and Q23. The second current-mirror type amplifier 31b comprises P channel MIS transistors Q24 and Q25 and N channel MIS transistors Q26 and Q27. In the second current-mirror type amplifier 31a, the transistors Q20 and Q22 constitute a first amplifying inverter, and the transistors Q21 and Q23 constitute a second amplifying inverter. In the second current-mirror type amplifier 31b, the transistors Q24 and Q26 constitute a first amplifying inverter, and the transistors Q25 and Q27 constitute a second amplifying inverter.

An N channel MIS transistor Q28 is employed as an activating transistor of the second current-mirror type amplifiers 31a and 31b.

The third current-mirror type amplifier 32 comprises P channel MIS transistors Q30 and Q31 and N channel MIS transistors Q32 and Q33. In the third current-mirror type amplifier 32, the transistors Q30 and Q32 constitute a first amplifying inverter, and the transistors Q31 and Q33 constitute a second amplifying inverter. An N channel MIS transistor Q34 is employed as an activating transistor of the third current-mirror type amplifier 32. Read-out data transferring lines OL and $\overline{OL}$ are connected to an output node of the third current-mirror type amplifier 32.

Additionally, a P channel MIS transistor Q29 is connected between the output nodes N13 and N14 of the second current-mirror type amplifiers 31a and 31b. The transistor Q29 is employed for equalizing potentials of the output nodes N13 and N14.

A read-out column decoded signal YR is applied to gates of transistors Q18 and Q19 of the first current-mirror type amplifier 30, the transistor Q28 of the second current-mirror type amplifiers 31a and 31b, and the transistors Q34 and Q29 of the third current-mirror type amplifier 32. The read-out column decoded signal YR is obtained by ANDing a read-out instruction signal R with a column decoded signal Y.

Figure 22:
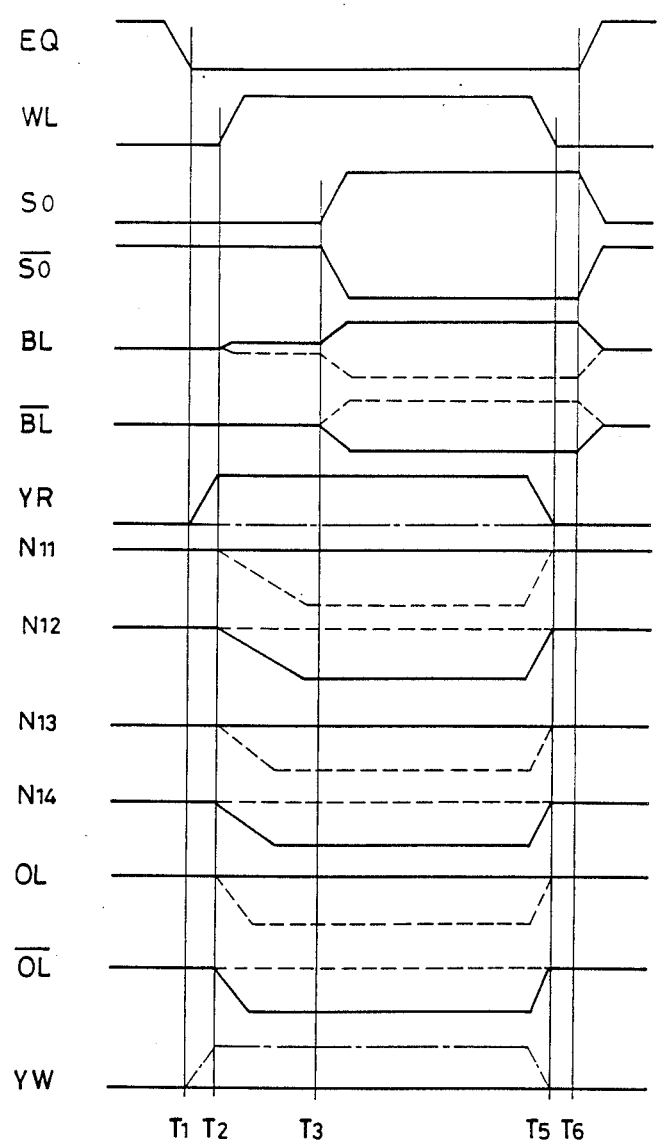
FIG. 22 is a timing chart for explaining a reading operation and a writing operation of the semiconductor memory device shown in FIG. 21.

Referring now to a timing chart of FIG. 22, description is made of a reading operation of the semiconductor memory device shown in FIG. 21.

At the time T1, when an equalizing signal EQ falls to a low level, transistors Q7 to Q9 are turned off, so that bit lines BL and $\overline{BL}$ are rendered electrically floating. In addition, when a read-out column decoded signal YR rises to a high level, the first current-mirror type amplifier 30 is activated. On this occasion, a write-in column decoded signal YW remains at a low level.

At the time T2, when a potential on a selected word line WL rises to a high level, a transistor Q0 of a memory cell 1 is turned on. For example, when data "1" is stored in the memory cell 1, a potential on the bit line BL is raised only slightly. Consequently, the first current-mirror type amplifier 30 starts to immediately amplify a potential difference between the bit lines BL and $\overline{BL}$ and increase a potential difference between output nodes N11 and N12.

Similarly, since transistors Q16 to Q19 constituting an input portion of the first current-mirror type amplifier 30 are connected to another plurality of bit line pairs (not shown), an interconnection constituting the output nodes N11 and N12 of the first current-mirror type amplifier 30 becomes longer. Therefore, an output load capacitance of the first current-mirror type amplifier 30 is increased. Thus, in order for a sufficient potential difference to be provided at the output nodes N11 and N12 of the first current-mirror type amplifier 30, the same amount of time is necessary as the time necessary for a sufficient potential difference to be provided to the read-out data transferring lines OL and $\overline{OL}$ in the semiconductor memory device shown in FIG. 15. However, in the semiconductor memory device according to the present embodiment, the second current-mirror type amplifiers 31a and 31b having as inputs the output nodes N11 and N12 of the first current-mirror type amplifier 30 have been already activated by the read-out column decoded signal YR at the time T1. Consequently, when a potential difference starts to appear between the output nodes N11 and N12 of the first current-mirror type amplifier 30, the second current-mirror type amplifiers 31a and 31b immediately increase the potential difference, to output the same to the output nodes N13 and N14. In this case, output load capacitances of the output nodes N13 and N14 in the second current-mirror type amplifiers 31a and 31b are subsequently smaller, as compared with output load capacitances of the output nodes N11 and N12 of the first current-mirror type amplifier 30. Therefore, the time elapsed until a considerable potential difference is provided between the output nodes N13 and N14 becomes shorten as compared with the time elapsed until a considerable potential difference is provided between the output nodes N11 and N12.

Furthermore, similarly, the third current-mirror type amplifier 32 having as inputs the output nodes N13 and N14 of the second current-mirror type amplifiers 31a and 31b has been already activated by the read-out column decoded signal YR at the time T1. Consequently, the third current-mirror type amplifier 32 immediately amplifies a very small potential difference appearing between the output nodes N13 and N14 of the second current-mirror type amplifiers 31a and 31b, to output the same as a potential difference between the read-out data transferring lines OL and $\overline{OL}$. More specifically, in this example, a potential on the read-out data transferring line $\overline{OL}$ is lowered to a low level while a potential on the read-out data transferring line OL remains at a high level.

Thereafter, the potential difference between the read-out data transferring lines OL and $\overline{OL}$ is further amplified by another amplifier (not shown), so that a high level output appears at an external output terminal (not shown).

Thus, read data can be quickly amplified immediately after the rise of the potential on the word line WL, so that access time can be significantly shortened.

At the time T3, the sense amplifiers 2 and 3 are activated in response to sense amplifier activation signals SO and $\overline{SO}$, and a slight potential difference appearing between the bit lines BL and $\overline{BL}$ is amplified so that the potential on the bit line BL is changed to the power-supply potential Vcc while the potential on the bit line $\overline{BL}$ is changed to 0V.

Meanwhile, when data "0" is stored in the memory cell 1, the potential on the bit line $\overline{BL}$ becomes the power-supply potential Vcc while the potential on the bit line BL becomes 0V as represented by broken lines in FIG. 22.

At the time T5, the potential on the word line WL falls to a low level and the read-out column decoded signal YR falls to a low level. At the time T6, when the equalizing signal EQ becomes a high level again, the bit lines BL and $\overline{BL}$ are precharged at a Vcc/2 level precharge potential $V_{BL}$.

On the other hand, in a writing operation, when the write-in column decoded signal YW rises to a high level at the time T1 as represented by a dot and dash line in FIG. 22, the transistors Q12 and Q13 are turned on, so that the levels of potentials on write-in data transferring lines IL and $\overline{IL}$ are transmitted to the bit lines BL and $\overline{BL}$. On this occasion, the read-out column decoded signal YR remains at a low level as represented by a dot and the dash line.

When the potential on the selected word line WL rises to a high level at the time T2, the potentials on the bit lines BL and $\overline{BL}$ are transmitted to the memory cell. In the above described manner, writing is performed.

In the above described embodiment, the first, second and third current-mirror type amplifiers 30, 31a, 31b and 32 are activated in response to the read-out column decoded signal YR, so that the current-mirror type amplifiers are not activated at the time of data writing. Thus, power consumption is reduced.

Although in the above described embodiment, data read out to the bit lines BL and $\overline{BL}$ are amplified by three stages of current mirror type sense amplifiers, to be outputted to the read-out data transferring lines OL and $\overline{OL}$. However, the current-mirror type amplifiers are not limited to three stages of current mirror type amplifiers. For example, in consideration of an input load of a current-mirror type amplifier having a potential on a bit line as an input signal and ar output load of a current-mirror type amplifier having read-out data transferring lines OL and $\overline{OL}$ as output nodes, two or more stages of current-mirror type amplifiers may be provided to be activated by a read-out column decoded signal, to obtain the same effect.

Figure 23:
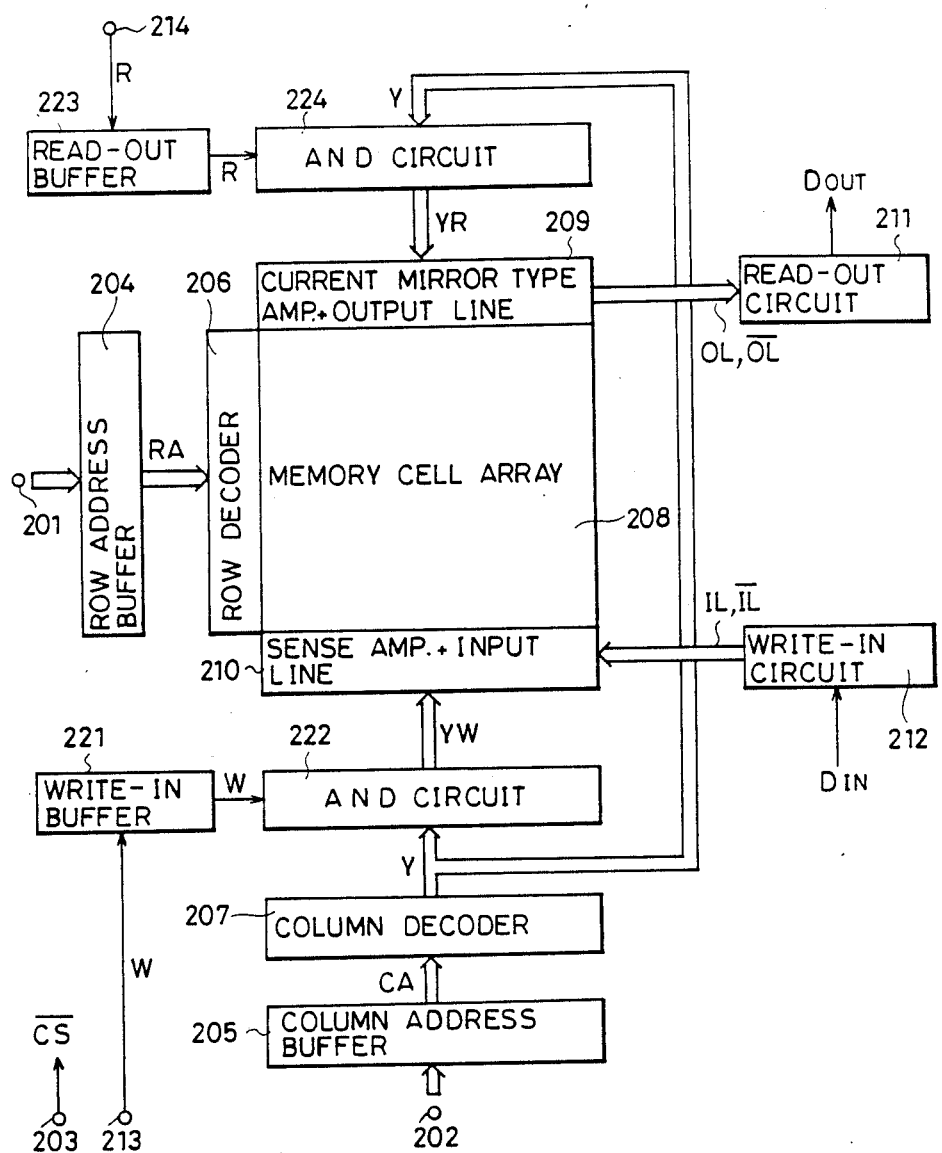
FIG. 23 is a block diagram showing one example of an entire structure of the semiconductor memory device shown in FIG. 21.

FIG. 23 is a block diagram showing one example of an entire structure of the semiconductor memory device show in FIG. 21.

A column decoder 207 is responsive to an internal column address signal CA for generating a column decoded signal Y to apply the same to AND circuits 222 and 224.

In addition, a read-out buffer 223 applies a read-out instruction signal R applied to a read-out terminal 214 to the AND circuit 224. The AND circuit 224 ANDs a column decoded signal Y with the read-out instruction signal R, to apply the same to a (current-mirror type amplifier+output line) block 209 as a read-out column decoded signal YR.

Figure 24:
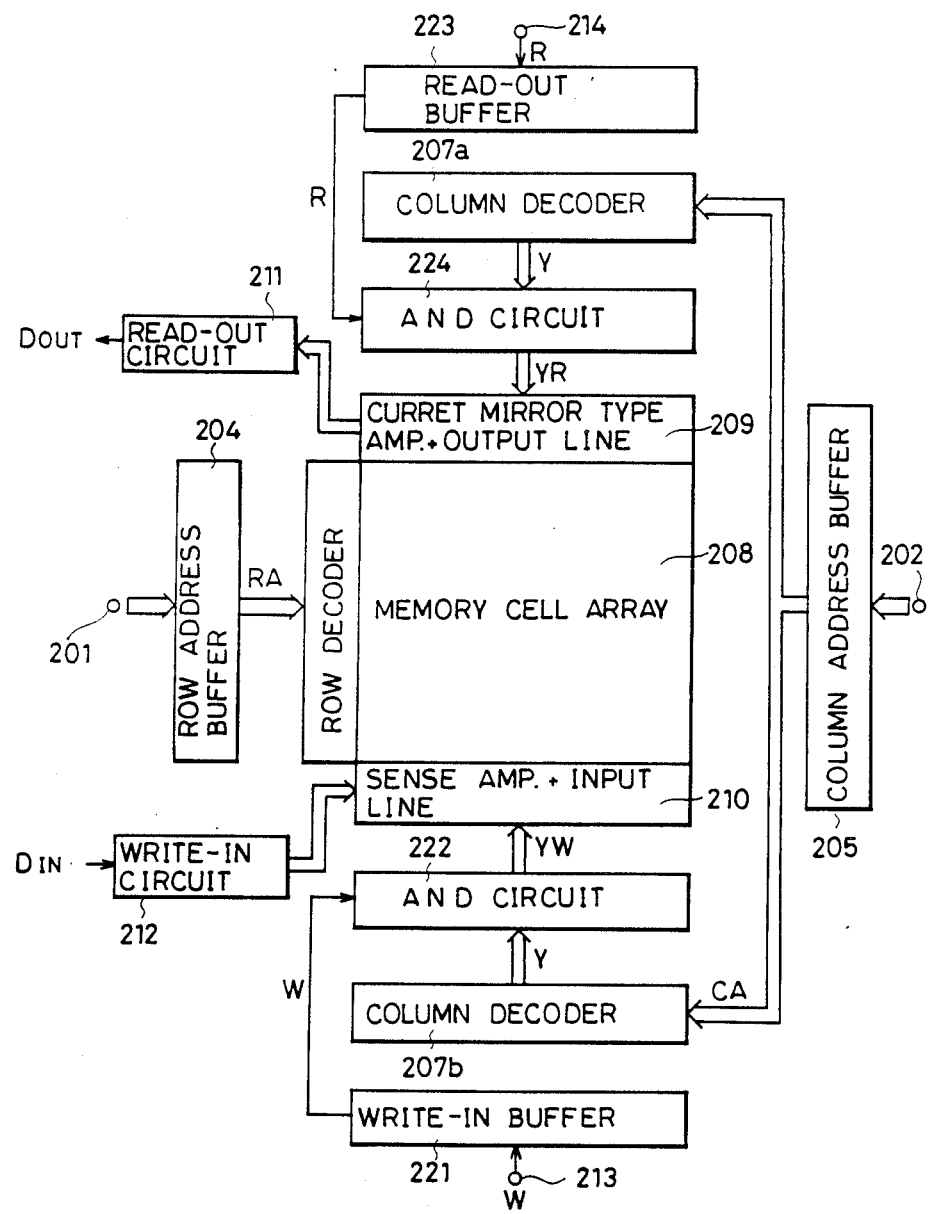
FIG. 24 is a block diagram showing another example of the entire structure of the semiconductor memory device shown in FIG. 21.

FIG. 24 is a block diagram showing another example of the entire structure of the semiconductor memory device shown in FIG. 21.

An address signal applied to a column address input terminal 202 is applied to column decoders 207a and 207b through a column address buffer 205. The column decoder 207a is responsive to an internal column address signal CA for generating a column decoded signal Y to apply the same to an AND circuit 214. On the other hand, the column decoder 207b is responsive to the internal column address signal CA for generating a column decoded signal Y to apply the same to an AND circuit 222. The AND circuit 224 ANDs the column decoded signal Y with a read-out instruction signal R, to apply the result to a (current-mirror type amplifier+output line) block 209 as a read-out column decoded signal YR. The AND circuit 222 ANDs the column decoded signal Y with a write-in instruction signal W, to apply the result to a (sense amplifier+input line) block 210 as a write-in column decoded signal YW.

Meanwhile, the present invention can be also applied to a semiconductor memory device of a type using a potential stored in a dummy cell as a reference potential for comparison at the time of data reading.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory cell array comprising a plurality of memory cells arranged in rows and columns, a plurality of word lines for selecting one row out of said memory cell array, and a plurality of bit lines for selecting one column out of said memory cell array, said plurality of bit lines constituting a pair of folded bit lines, comprising:

row address inputting means for receiving an externally applied row address, row selecting means responsive to the row address from said row address inputting means for selecting one row out of said memory cell array, column address inputting means for receiving an externally applied column address, column selecting means responsive to the column address from said column address inputting means for selecting one bit line pair to select memory cells in one column out of said memory cell array, write-in signal inputting means for receiving an externally applied write-in signal, a pair of write-in data transferring lines for transferring data to be written in a memory cell selected by said row address and said column address at the time of data writing, combining means for combining an output of said column selecting means and said write-in signal from said write-in signal inputting means to form an input line connect signal, connecting means responsive to said input line connect signal for connecting the bit line pair selected by said column address to said pair of write-in data transferring lines at the time of data writing, a pair of read-out data transferring lines provided separately from said pair of write-in data transferring lines for transferring data on a bit line pair selected by said column address at the time of data reading, and amplifying means responsive to the output of said column selecting means for driving said pair of read-out data transferring lines in accordance with data on said selected bit line pair, said amplifying means comprising
   means for detecting a voltage difference of said selected bit line pair, first and second voltage amplifying means for respectively amplifying voltages on bit lines of said selected bit line pair, means for establishing a positive feedback signal flow path between said first and second voltage amplifying means, to increase the rate of the change in voltage of said first and second voltage amplifying means, means responsive to said first and second voltage amplifying means for adjusting first and second currents, means for converting said first and second currents into a voltage difference, and means for applying said voltage difference to said pair of read-out data transferring lines.

2. The semiconductor memory device according to claim 1, wherein said connecting means comprises a plurality of switching means each connected between each of said plurality of bit line pairs and said pair of write-in data transferring lines and responsive to the output of said column selecting means and said write-in signal from said write-in signal inputting means to be rendered conductive.

3. The semiconductor memory device according to claim 2, which further comprises writing column selecting means responsive to said write-in signal from said write-in signal inputting means for outputting the output of said column selecting means as a column selection signal for writing.

4. The semiconductor memory device according to claim 3, wherein each of said plurality of switching means comprises a field effect transistor connected between one of the corresponding bit line pair and one of said pair of write-in data transferring lines and having a gate receiving said column selecting signal for writing, and a field effect transistor connected between the other of said corresponding bit line pair and the other of said pair of write-in data transferring lines and having a gate receiving said column selecting signal for writing.

5. The semiconductor memory device according to claim 1, wherein said amplifying means comprises a current-mirror type amplifier comprising a plurality of insulating gate type first, second, third and fourth field effect devices provided corresponding to said plurality of bit lines pairs, a plurality of first and second nodes provided corresponding to said plurality of bit lines pairs, and at least one insulating gate type fifth and sixth field effect devices, each of said plurality of first field effect devices being coupled between a predetermined first potential and the corresponding first node and having a control terminal connected to one of the corresponding bit line pair, each of said plurality of second field devices being coupled between the corresponding second node and having a control terminal connected to the other of the corresponding bit line pair, each of said plurality of third field effect devices being coupled between the corresponding first node and one of said pair of read-out data transferring lines and having a control terminal receiving the output of said column selecting means, each of said plurality of fourth field effect devices being coupled between the corresponding second node and the other of said pair of read-out data transferring lines and receiving the output of said column selecting means, said fifth field effect device being coupled between a predetermined second potential and one of said pair of read-out data transferring lines and having a control terminal, and said sixth field effect device being coupled between said predetermined second potential and the other of said pair of read-out data transferring lines and having a control terminal connected to the control terminal of said fifth field effect device and one or the other of said pair of read-out data transferring lines.

6. The semiconductor memory device according to claim 1, which further comprises read-out signal inputting means for receiving an externally applied read-out signal, said amplifying means being responsive to the output of said column selecting means and said read-out signal from said read-out signal inputting means to be activated.

7. The semiconductor memory device according to claim 6, which further comprises reading column selecting means responsive to said read-out signal (R) from said read-out signal inputting means for outputting the output of said column selecting means as a column selecting signal for reading.

8. A semiconductor memory device having a memory cell array comprising a plurality of memory cells arranged in rows and columns, a plurality of word lines for selecting one row out of said memory cell array, and a plurality of bit lines for selecting one column out of said memory cell array, said plurality of bit lines constituting a pair of folded bit lines, comprising:

row address inputting means for receiving an externally applied row address, row selecting means responsive to the row address from said row address inputting means for selecting one row out of said memory cell array, column address inputting means receiving an externally applied column address, column selecting means responsive to the column address from said column address inputting means for selecting one bit line pair to select one column out of said memory cell array, a pair of write-in data transferring lines connected to the bit line pair selected by said column address in response to an output of said column selecting means to transfer data to be written in a memory cell selected by said row address and said column address, at the time of data writing, a pair of read-out data transferring lines provided separately from said pair of write-in data transferring lines for transferring data on a bit lint pair selected by said column address at the time of data reading, and amplifying means responsive to the output of said column selecting means for driving said pair of read-out data transferring lines in accordance with data on said selected bit line pair, said amplifying means comprising a plurality of insulating gate type first, second, third and fourth field effect devices provided corresponding to the plurality of bit line pairs, a plurality of first and second nodes provided corresponding to said plurality of bit line pairs and at least one of insulating gate type fifth and sixth field effect devices, each of said plurality of first field effect devices being coupled between a predetermined first potential and the corresponding first node and having a control terminal connected to one bit line of the corresponding bit line pair, each of said plurality of second field effect devices being coupled between said predetermined first potential and the corresponding second node and having a control terminal connected to the other bit line of the corresponding bit line pair, each of said plurality of third field effect devices being coupled between the corresponding first node and one of said pair of read-out data transferring lines and having a control terminal receiving the output of said column selecting means, each of said plurality of fourth field effect devices being coupled between the corresponding second node and the other of said pair of read-out data transferring lines and having a control terminal receiving the output of said column selecting means, said fifth field effect device being coupled between a predetermined second potential and one of said pair of read-out data transferring lines and having a control terminal, said sixth field effect device being coupled between said predetermined second potential and the other of said pair of read-out data transferring lines and having a control terminal connected to the control terminal of said fifth field effect device and one or the other of said pair of read-out data transferring lines.

9. A semiconductor memory device having a memory cell array comprising a plurality of memory cells arranged in rows and columns, a plurality of word lines for selecting one row out of said memory cell array, and a plurality of bit lines for selecting one column out of said memory cell array, said plurality of bit lines constituting a pair of folded bit lines, comprising:

row address inputting means for receiving an externally applied row address, row selecting means responsive to the row address from said row address inputting means for selecting one row out of said memory cell array, column address inputting means receiving an externally applied column address, column selecting means responsive to the column address from said column address inputting means for selecting one bit line pair to select the memory cells in one column out of said memory cell array, a pair of write-in data transferring lines, connected to the bit line pair designated by said column address in response to an output of said column selecting means to transfer data to be written in a memory cell selected by said row address and said column address at the time of data writing, a pair of read-out data transferring lines provided separately from said pair of write-in data transferring lines for transferring data on the bit line pair designated by said column address at the time of data reading, and a plurality of stages of amplifying means responsive to the output of said column selecting means to be rendered active, the first stage of amplifying means out of said plurality of stages of amplifying means amplifying data on the bit line pair designated by said column address, and the last stage of amplifying means out of said plurality of stages of amplifying means amplifying an output of the preceding stage of amplifying means to provide the amplified output to said pair of read-out data transferring lines, each of said plurality of stages of amplifying means comprising means for detecting a voltage difference of said selected bit line pair first and second voltage amplifying means for respectively amplifying voltages on bit lines of said selected bit line pair, means for establishing a positive feedback signal flow path between said first and second voltage amplifying means, to increase the rate of the change in voltage of said first and second voltage amplifying means, means responsive to said first and second voltage amplifying means for adjusting first and second currents, means for converting said first and second currents to a voltage difference, and outputting means for outputting said voltage difference.

10. The semiconductor memory device according to claim 9, wherein each of said plurality of stages of amplifying means comprises a current-mirror type sense amplifier comprising a plurality of insulating gate type field effect transistors.

11. An accessing method in a semiconductor memory device comprising a plurality of word lines; a plurality of bit lines having a folded bit line structure in which two bit lines are paired with each other; a plurality of memory cells respectively provided at intersections of the word lines and the bit lines; a first pair of data buses for transferring data to be written; a second pair of data buses provided separately from said first pair of data buses for transferring data to be read; and amplifying means provided between said second pair of data buses and said plurality of bit line pairs, which comprises the steps of:

selecting any one of said plurality of word lines in response to an externally applied row address to activate the selected word line, combining an externally applied column address and an externally applied write-in signal to form an input line connect signal, connecting, in response to said input line connect signal, one bit line pair selected by said column address to said first pair of data buses at the time of data writing, combining the externally applied column address and an externally applied read-out signal to form an output line connect signal, and activating, in response to the output line connect signal, said amplifying means to drive said first pair of data buses in accordance with data on one bit line pair designated by said column address at the time of data reading.

12. A semiconductor memory device comprising:

a plurality of memory cells in rows and columns, a plurality of word lines arranged in rows, each word line connected to said memory cells arranged in a corresponding row, respectively, a plurality of bit line pairs arranged in columns, each bit line pairs having a folded bit line structure and connected to said memory cells arranged in a corresponding column, respectively, a pair of input lines, one of a pair of input lines connected to one of said bit line pairs through a first transfer means for writing data, the other of a pair of input lines connected to the other of said bit line pairs through a second transfer means, a pair of output lines connected to a first potential node, and a plurality of transfer means for reading out data, each transfer means for reading out data arranged in columns and having a first, second, third and fourth transistors having a pair of main electrode and control electrode, one of a pair of main electrodes of said first transistor connected to a second potential node, the control electrode of said first transistor connected to one of a corresponding bit line pairs, said second transistor connected between the other of a pair of main electrodes of said first transistor and one of a pair of said output lines, the control electrode of said second transistor receiving a column address signals, one of a pair of main electrodes of said third transistor connected to said second potential node, the control electrode of said third transistor connected to the other of a corresponding bit line pairs, said fourth transistor connected between the other of a pair of main electrode of said third transistor and the other of a pair of said output lines, the control electrode of said fourth transistor receiving said column address signals.

13. A semiconductor memory device comprising;

a plurality of memory cells arranged in rows and columns, a plurality of word lines arranged in rows, each word line connected to said memory cells arranged in a corresponding row, respectively, a plurality of bit line pairs arranged in columns, each bit line pairs having a folded bit line structure and connected to said memory cells arranged in a corresponding column, respectively, a pair of output lines, one of a pair of output lines connected to one of said bit line pairs through a first transfer means for reading out data, the other of a pair of output lines connected to the other of said bit line pairs through a second transfer means for reading out data, a pair of input lines, and a plurality of transfer means for writing data, each transfer means for writing data arranged in columns and having first and second transistors, said first transistor connected between one of a pair of input lines and one of a corresponding bit line pairs, said second transistor connected between the other of a pair of input lines and the other of said corresponding bit line pairs, the control electrode of said first and second transistors receiving a combined write-in and column address signal.

14. A connection means for use in a dynamic random access memory for connection of pairs of bit lines to respective output lines comprising:

addressable means for outputting an enabling signal on an output enabling line in response to an address applied thereto, two current mirror amplifiers each amplifier comprising a pair of transistors comprising a first and a second field effect transistor having the conduction terminals thereof connected in series between a power supply voltage source and a reference voltage source, the gates of the first field effect transistors in each amplifier having control terminals connected together and to one of said output lines and the control terminals of each of said second field effect transistors being connected to respective ones of said pair of bit lines, said output lines being connected to a conduction terminal of said first field effect transistor, and a pair of further transistors, the conduction terminals of each of said further transistors being connected in series with the first and second transistors of a respective current mirror amplifier and having a control terminal thereof being connected to said output enabling line.

15. A connection means as recited in claim 14 wherein each of said pair of further transistors is interposed between the first and second field effect transistors of each said current mirror amplifier.

16. A connection means for use in a dynamic random access memory for connection of pairs of intermediate output lines to respective data output lines comprising:

activation means for producing a selective activation signal on an activation line, two current mirror amplifiers each amplifier comprising a pair of transistors comprising a pair of first field effect transistors and a pair of second field effect transistor having the conduction terminals thereof connected in series between a power supply voltage source and a common node, the gates of the first field effect transistors in each pair having control terminals connected together and to one of said conduction terminals one field effect transistor of each pair of said first field effect transistors and the control terminals of each of said second field effect transistors being connected to respective ones of said intermediate output bit lines, said data output lines being connected to a conduction terminal of the other first field effect transistor of each pair, and a pair of further transistors of opposite conductivity types, the conduction terminals of one transistor of said pair being connected in series between said common node and a source of reference voltage and the conduction terminals of the other transistor of said pair being connected between said data output lines for equalization of the potentials thereon and having control terminals of both said further transistors being connected to said activation line.

17. A connection means as recited in claim 16, further including a further current mirror amplifier comprising two further pairs of further first field effect transistors and further second field effect transistors, said further first and further second field effect transistors having conduction terminals thereof connected in series between a power supply voltage source and a further common node, the bases of the said further first field effect transistors in each pair having control terminals connected together and to one of said conduction terminals of one field effect transistor of each pair of said further first field effect transistors and the control terminals of each of said second field effect transistors being connected to respective ones of said pair of data output lines, outputs of said further current mirror amplifier being taken at the connection of the conduction terminals of each pair of said further first and said further second field effect transistors, and another transistor having conduction terminals connected to said further common node and a reference voltage source and a control terminal thereof connected to said activation line.

18. A semiconductor memory device having a memory cell array comprising a plurality of memory cells arranged in rows and columns, a plurality of word lines for selecting one row out of said memory cell array, and a plurality of bit lines for selecting one column out of said memory cell array, said plurality of bit lines constituting a pair of folded bit lines, comprising:

row address inputting means for receiving an externally applied row address, row selecting means responsive to the row address from said row address inputting means for selecting one row out of said memory cell array, column address inputting means for receiving an externally applied column address, column selecting means responsive to the column address from said column address inputting means for selecting one bit line pair to select memory cells in one column out of said memory cell array, write-in signal inputting means for receiving an externally applied write-in signal, a pair of write-in data transferring lines for transferring data to be written in a memory cell selected by said row address and said column address at the time of data writing, combining means for combining an output of said column selecting means and said write-in signal from said write-in signal inputting means to form an input line connect signal;

connecting means responsive to said input line connect signal for connecting the bit line pair selected by said column address to said pair of write-in data transferring lines at the time of data writing, a pair of read-out data transferring lines provided separately from said pair of write-in data transferring lines for transferring data on a bit line pair selected by said column address at the time of data reading, and amplifying means including a current mirror responsive to the output of said column selecting means for driving said pair of read-out data transferring lines in accordance with data on said selected bit line pair.

19. The semiconductor memory device according to claim 18, wherein said current mirror comprises MOS type transistors.

20. The semiconductor memory device according to claim 18, wherein said connecting means comprises a plurality of switching means each connected between each of said plurality of bit line pairs and said pair of write-in data transferring lines and responsive to the output of said column selecting means and said write-in signal from said write-in signal inputting means to be rendered conductive.

21. The semiconductor memory device according to claim 20, further comprising writing column selecting means responsive to said write-in signal from said write-in signal inputting means for outputting the output of said column selecting means as a column selection signal for writing.

22. The semiconductor memory device according to claim 21, wherein each of said plurality of switching means comprises:

a field effect transistor connected between one of the corresponding bit line pair and one of said pair of write-in data transferring lines and having a gate receiving said column selecting signal for writing, and a field effect transistor connected between the other of said corresponding bit line pair and the other of said pair of write-in data transferring line and having a gate receiving said column selecting signal for writing.

23. The semiconductor memory device according to claim 18, further comprising read-out signal inputting means for receiving an externally applied read-out signal, wherein said amplifying means is responsive to the output of said column selecting means and said read-out signal from said read-out signal inputting means to be activated.

24. The semiconductor memory device according to claim 23, further comprising reading column selecting means responsive to said read-out signal from said read-out signal inputting means for outputting the output of said column selecting means as a column selecting signal for reading.

25. A semiconductor memory device having a memory cell array comprising a plurality of memory cells arranged in rows and columns, a plurality of word lines for selecting one row out of said memory cell array, and a plurality of bit lines for selecting one column out of said memory cell array, said plurality of bit lines constituting a pair of folded bit lines, comprising:

row address inputting means for receiving an externally applied row address, row selecting means responsive to the row address from said row address inputting means for selecting one row out of said memory cell array, column address inputting means for receiving an externally applied column address, column selecting means responsive to the column address from said column address inputting means for selecting one bit line pair to select memory cells in one column out of said memory cell array, write-in signal inputting means for receiving an externally applied write-in signal, a pair of write-in data transferring lines for transferring data to be written in a memory cell selected by said row address and said column address at the time of data writing, combining means for combining an output of said column selecting means and said write-in signal from said write-in signal inputting means to form an input line connect signal;

connecting means responsive to said input line connect signal for connecting the bit line pair selected by said column address to said pair of write-in data transferring lines at the time of data writing, a pair of read-out data transferring lines provided separately from said pair of write-in data transferring lines for transferring data on a bit line pair selected by said column address at the time of data reading, and amplifying means including a current mirror responsive to the output of said column selecting means for driving said pair of read-out data transferring lines in accordance with data on said selected bit line pair.

26. The semiconductor memory device according to claim 25, wherein said current mirror comprises MOS type transistors.

27. The semiconductor memory device according to claim 25, wherein said connecting means comprises a plurality of switching means each connected between each of said plurality of bit line pairs and said pair of write-in data transferring lines and responsive to the output of said column selecting means and said write-in signal from said write-in signal inputting means to be rendered conductive.

28. The semiconductor memory device according to claim 27, further comprising writing column selecting means responsive to said write-in signal from said write-in signal inputting means for outputting in the output of said column selecting means as a column selection signal for writing.

29. The semiconductor memory device according to claim 28, wherein each of said plurality of switching means comprises:
   a field effect transistor connected between one of the corresponding bit line pair and one of said pair of write-in data transferring lines and having a gate receiving said column selecting signal for writing, and
   a field effect transistor connected between the other of said corresponding bit line pair and the other of said pair of write-in data transferring line and having a gate receiving said column selecting signal for writing.

30. The semiconductor memory device according to claim 25, further comprising read-out signal inputting means for receiving an externally applied read-out signal, wherein said amplifying means is responsive to the output of said column selecting means and said read-out signal from said read-out signal inputting means to be activated.

31. The semiconductor memory device according to claim 30, further comprising reading column selecting means responsive to said read-out signal from said read-out signal inputting means for outputting the output of said column selecting means as a column selecting signal for reading.

32. An accessing method in a semiconductor memory device comprising a plurality of word lines; a plurality of bit lines having a folded bit line structure in which two bit lines are paired with each other; a plurality of memory cells respectively provided at intersections of the word lines and the bit lines; a first pair of data buses for transferring data to be written; a second pair of data buses provided separately from said first pair of data buses for transferring data to be read; and amplifying means provided between said second pair of data buses and said plurality of bit line pairs, which comprises the steps of:
   selecting any one of said plurality of word lines in response to an externally applied row address to activate the selected word line,
   combining an externally applied column address and an externally applied write-in signal to form an input line connect signal, and
   connecting, in response to said input line connect signal, one bit line pair selected by said column address to said firs pair of data buses at the time of data writing.

* * * * *